US006829988B2

(12) United States Patent
George et al.

(10) Patent No.: US 6,829,988 B2
(45) Date of Patent: Dec. 14, 2004

(54) NANOIMPRINTING APPARATUS AND METHOD

(75) Inventors: Gregory A. George, Colchester, VT (US); Hale L. Johnson, Jericho, VT (US); David T. Meyer, Jeffersonville, VT (US)

(73) Assignee: Suss MicroTec, Inc., Waterbury Center, VT (US)

( * ) Notice: Subject to any disclaimer, the term of this patent is extended or adjusted under 35 U.S.C. 154(b) by 0 days.

(21) Appl. No.: 10/439,883

(22) Filed: May 16, 2003

(65) Prior Publication Data

US 2004/0226460 A1 Nov. 18, 2004

(51) Int. Cl.[7] .................................................. B41F 1/01
(52) U.S. Cl. .............................. 101/17; 32/483; 32/3.1; 32/16; 32/28
(58) Field of Search ........................... 101/483, 17, 32, 101/3.1, 4, 16, 28, 324, 474

(56) References Cited

U.S. PATENT DOCUMENTS

| | | | | |
|---|---|---|---|---|
| 5,772,905 A | | 6/1998 | Chou | 216/44 |
| 5,947,027 A | * | 9/1999 | Burgin et al. | 101/474 |
| 6,062,133 A | * | 5/2000 | Blalock | 100/211 |
| 6,518,189 B1 | | 2/2003 | Chou | 438/706 |
| 2004/0090611 A1 | * | 5/2004 | Choi et al. | 355/75 |

OTHER PUBLICATIONS

"State of the Art Automated Nonoimprinting of Polymers and its Challenges", C: Shaefer et al., URL EV Group Inc.
"One Micron Precision Optically Aligned Method for Hot–Embossing and Nanoimprinting", R. Islam et al., URL EV Group Inc.
"Nanoimprint Lithography with a Commercial 4 Inch Bond System for Hot Embossing", K. Pfeiffer et al., URL EV Group Inc.

* cited by examiner

Primary Examiner—Eugene H. Eickholt
(74) Attorney, Agent, or Firm—Perman & Green, LLP

(57) ABSTRACT

A nanoimprinting apparatus for imprinting nanostructure on a workpiece. The apparatus comprises a frame, a platen, an embossing tool, and a separating tool. The platen is connected to the frame for separating the workpiece. The embossing tool is connected to the frame for imprinting nanostructure on the workpiece. The separating tool is connected to the frame for separating the workpiece and embossing tool. The separating tool has a workpiece engagement surface for engaging the workpiece when separating the workpiece and embossing tool. The embossing tool extends through the separating tool.

27 Claims, 14 Drawing Sheets

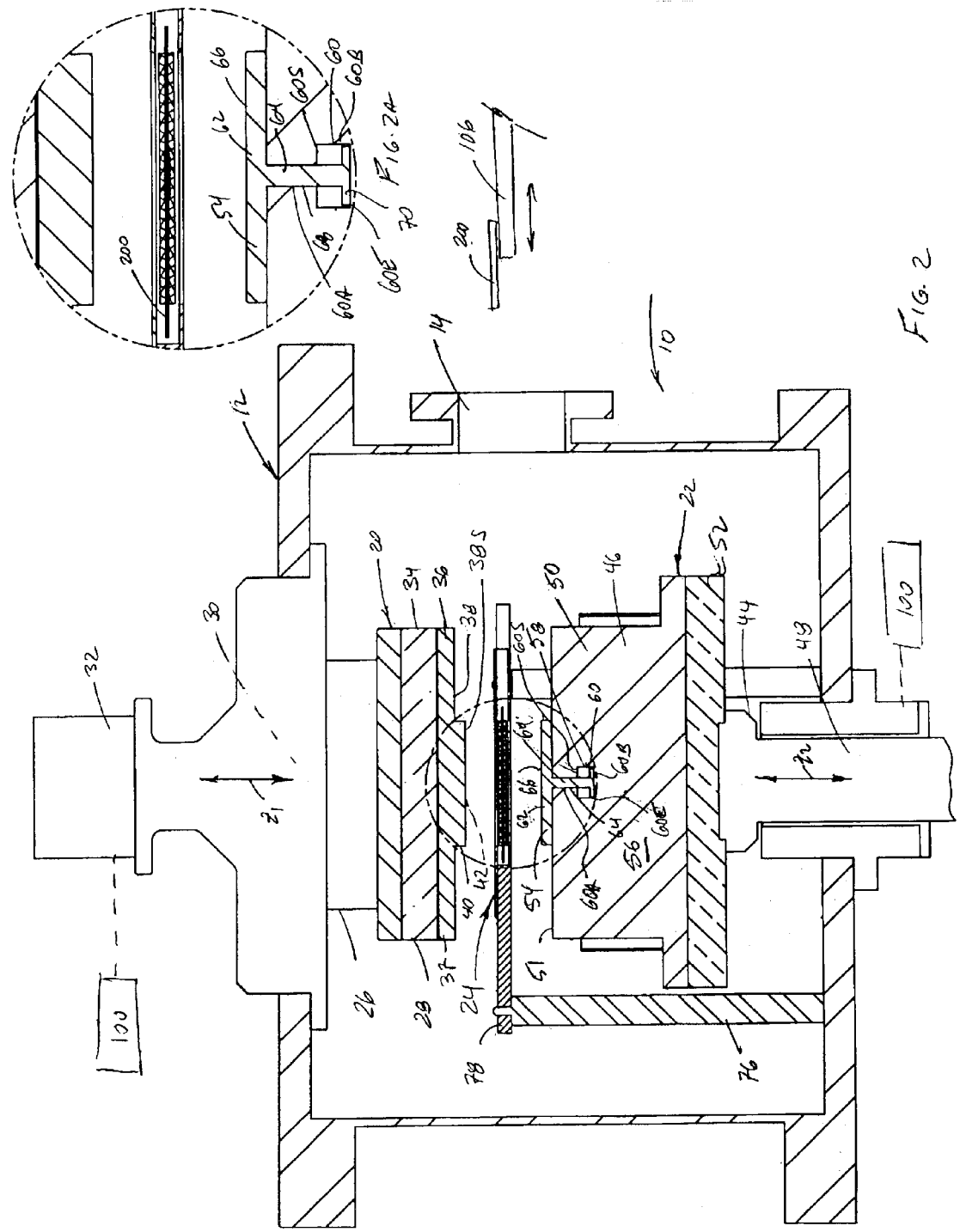

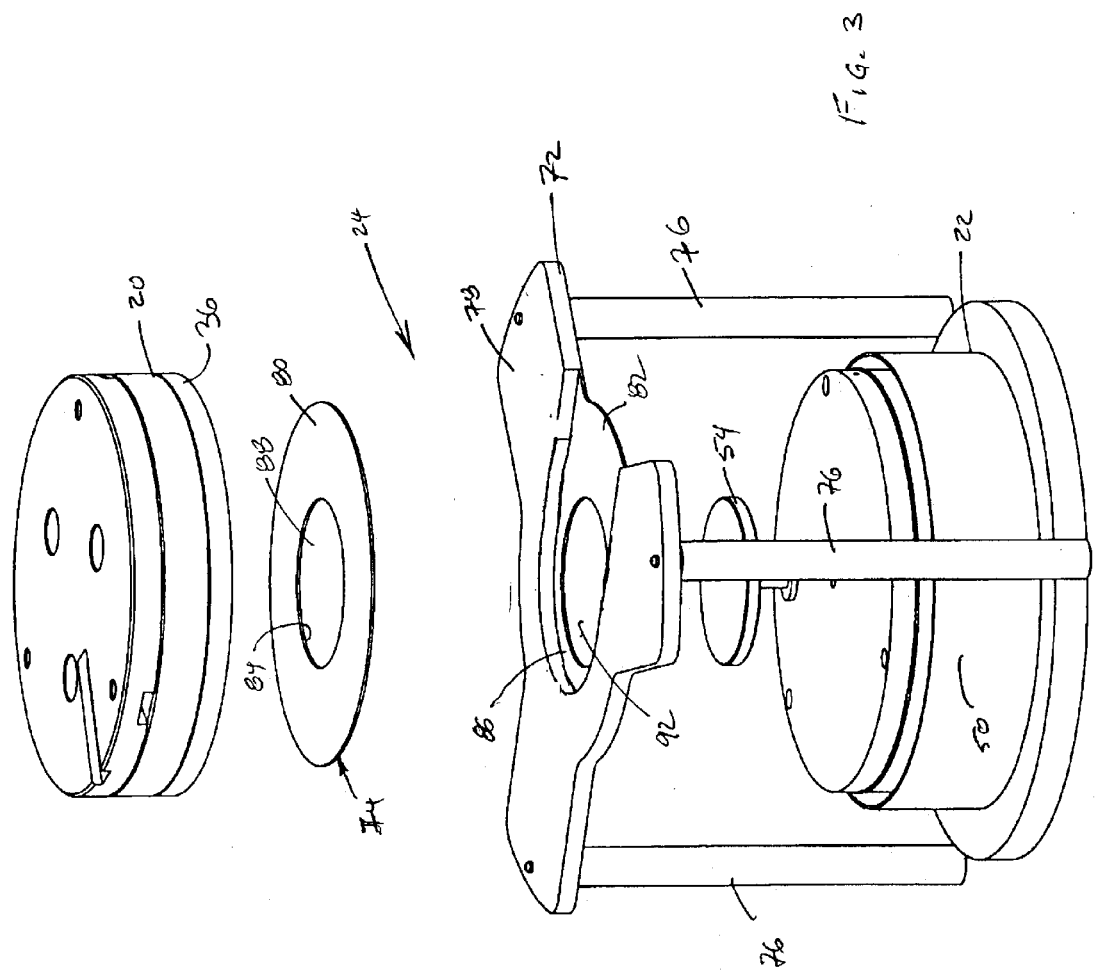

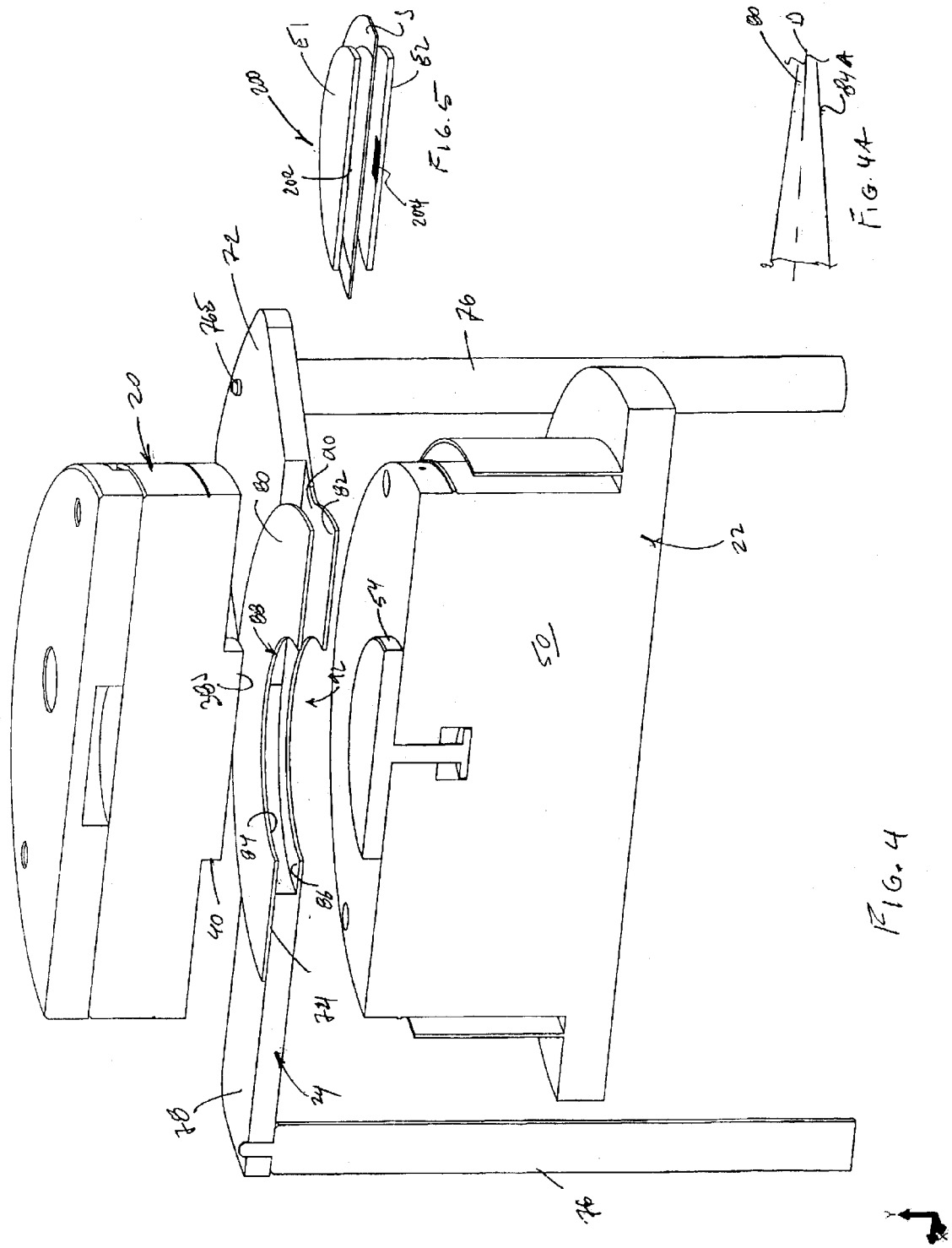

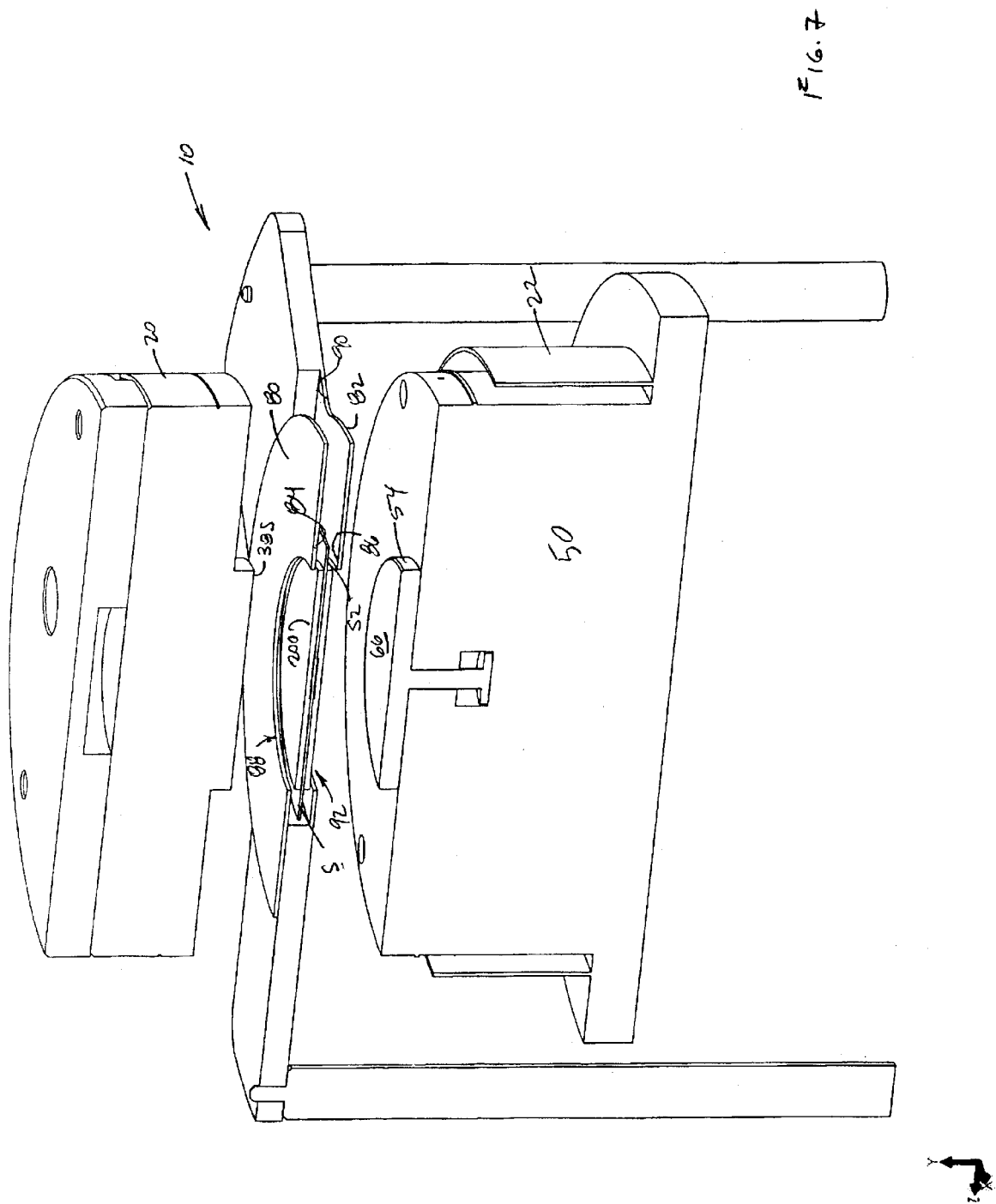

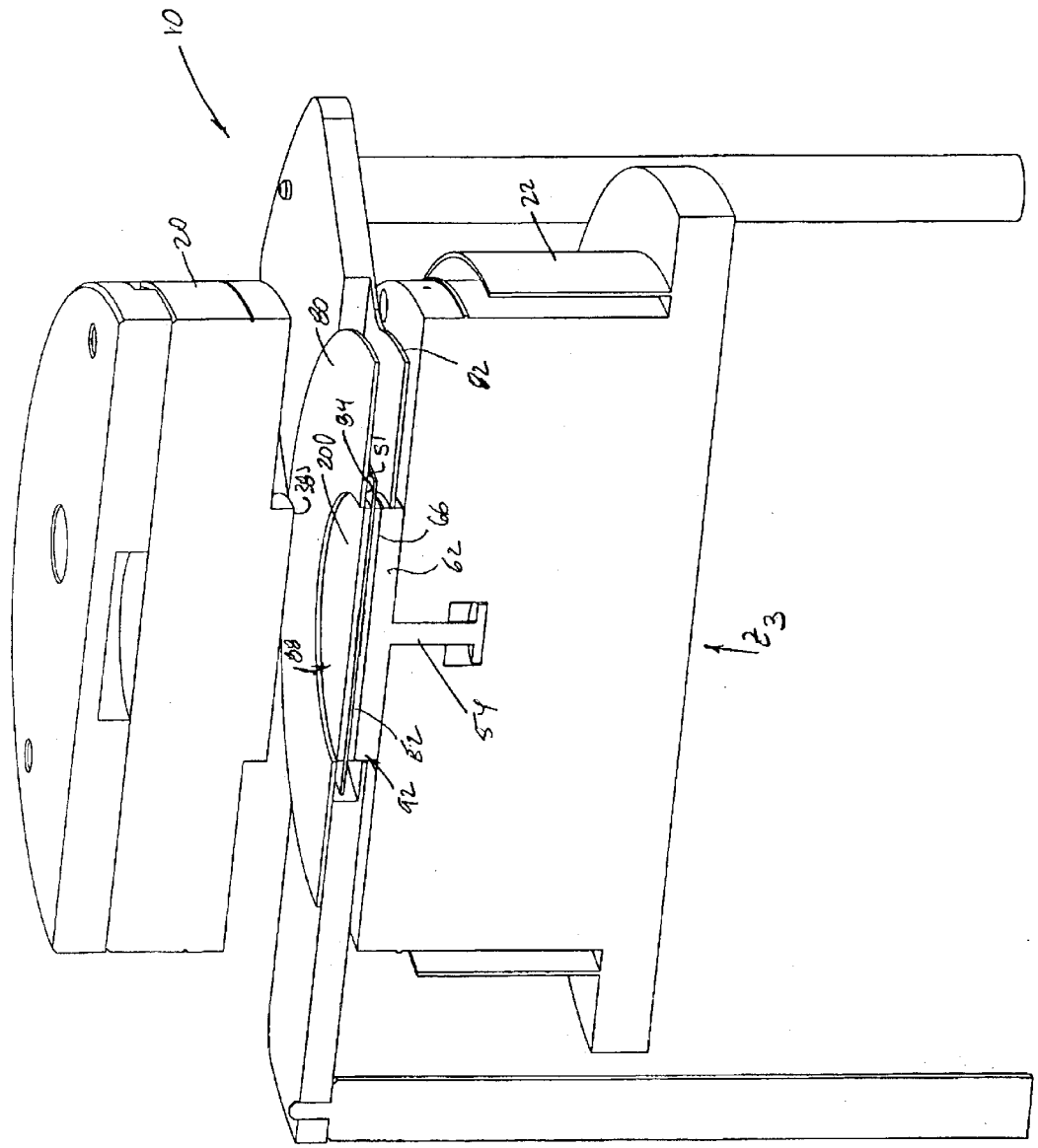

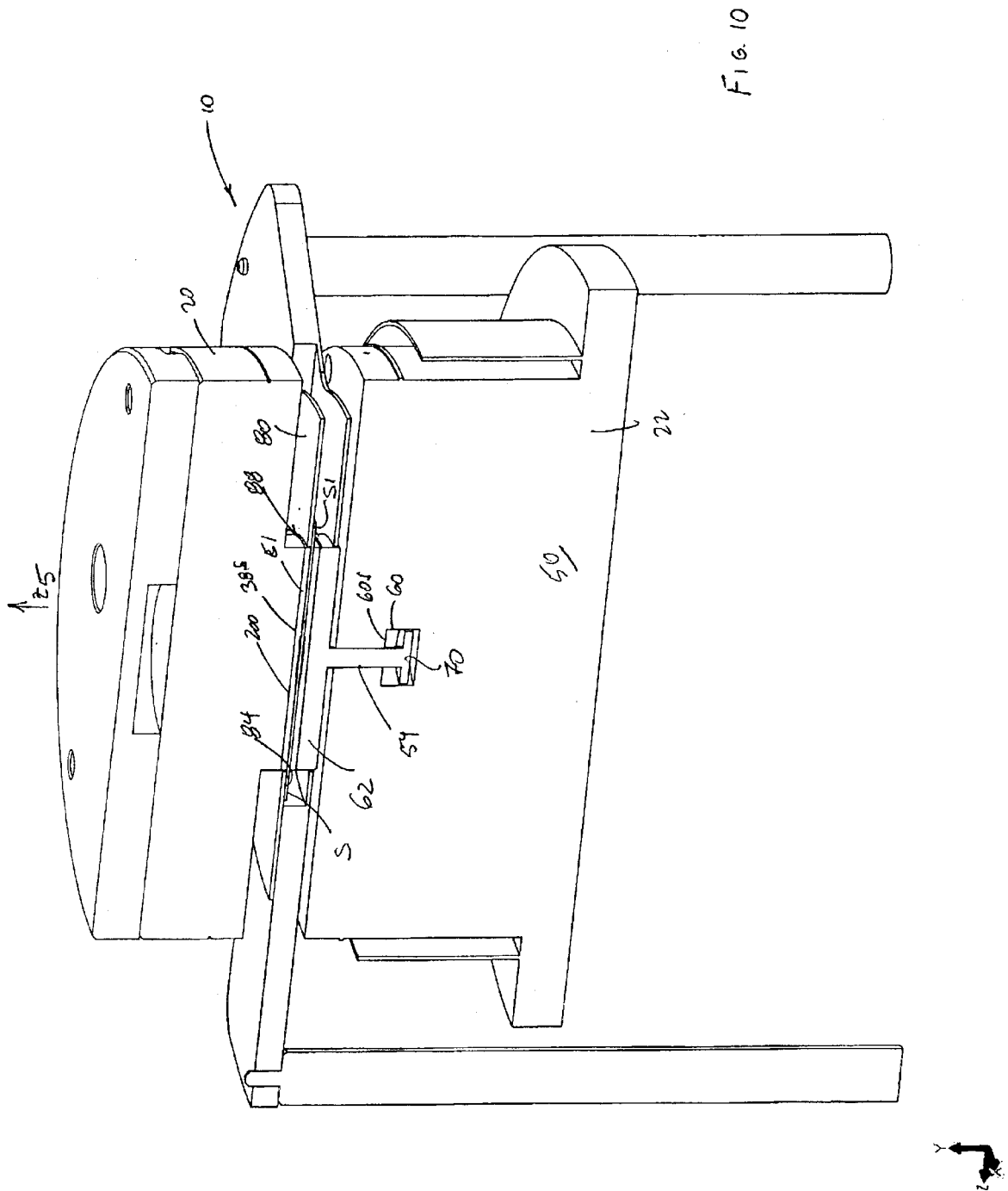

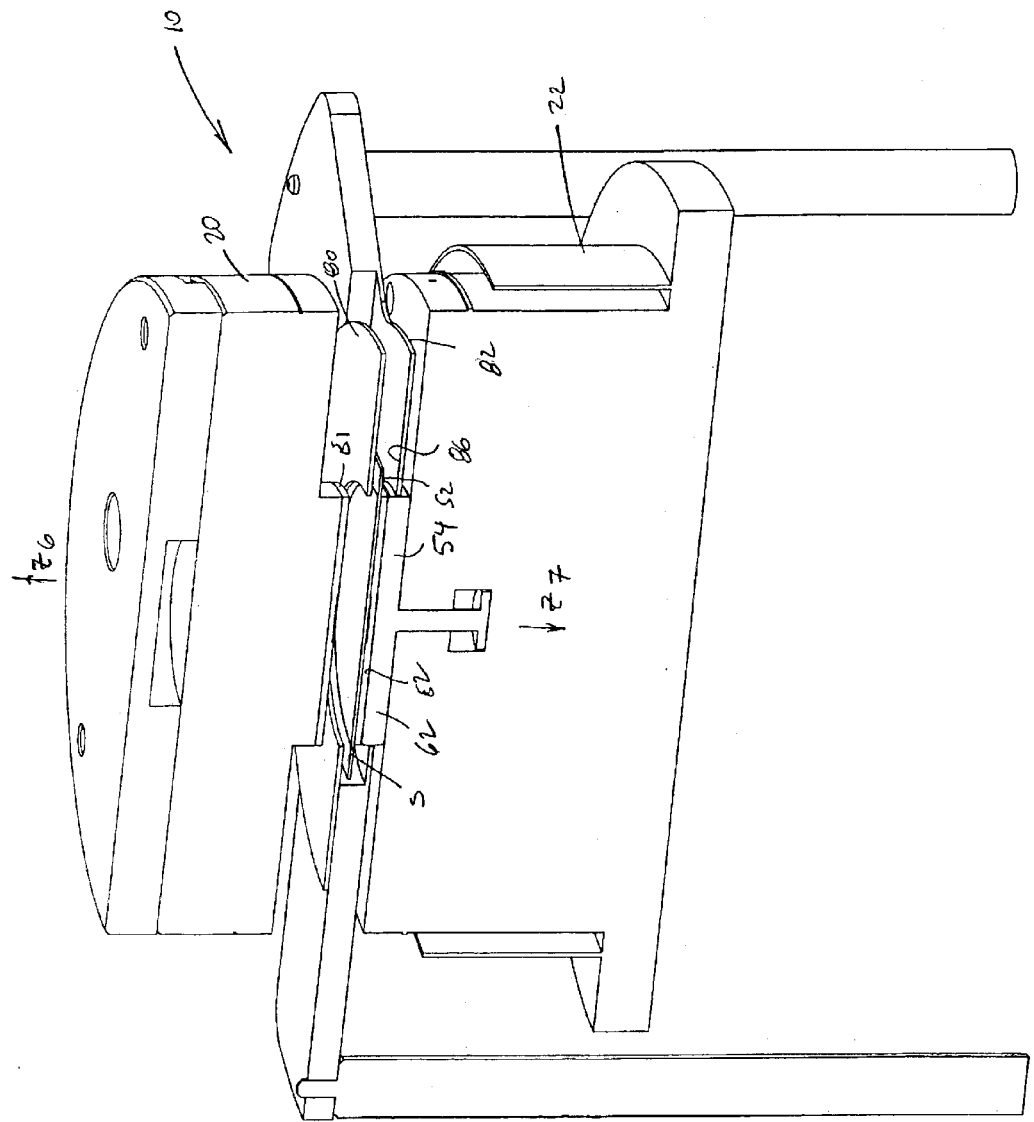

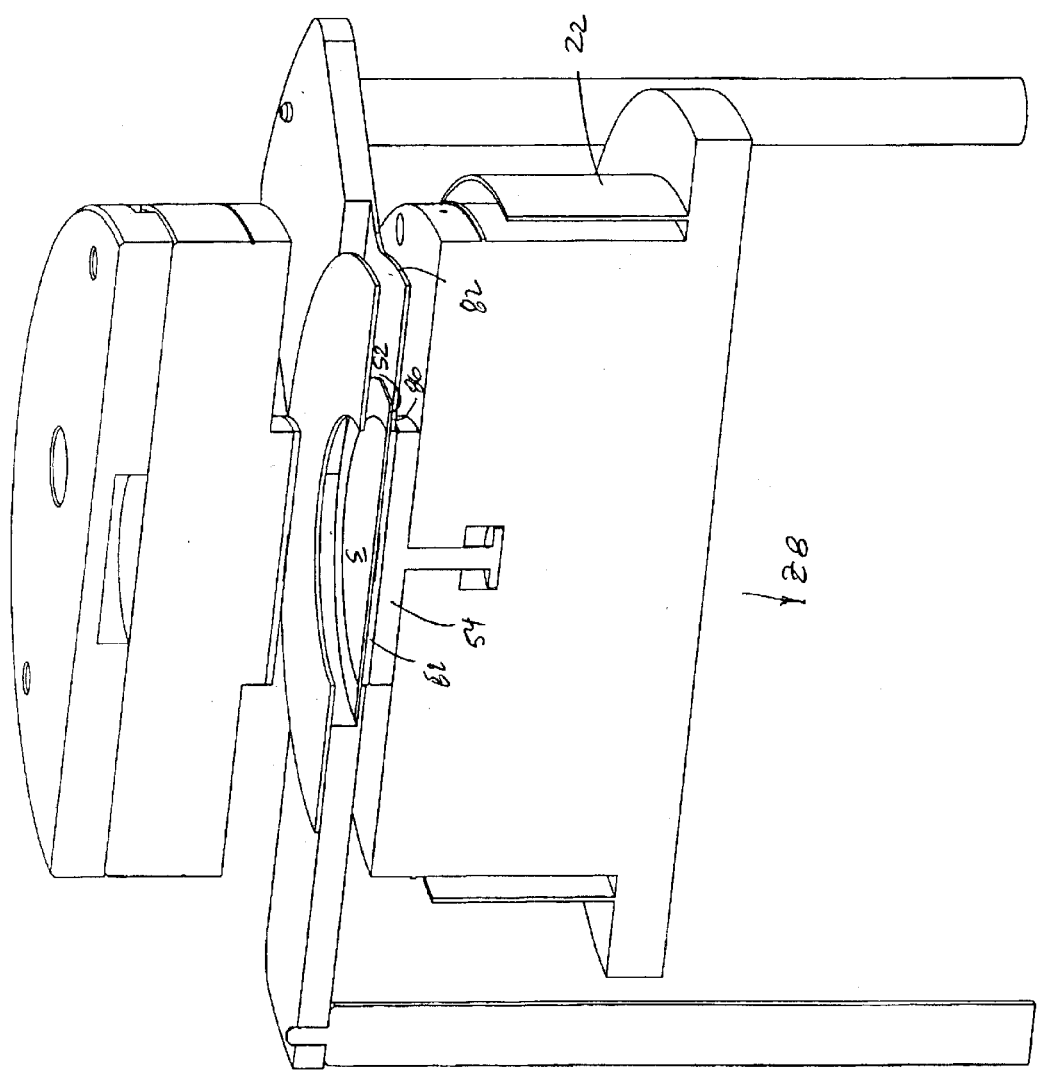

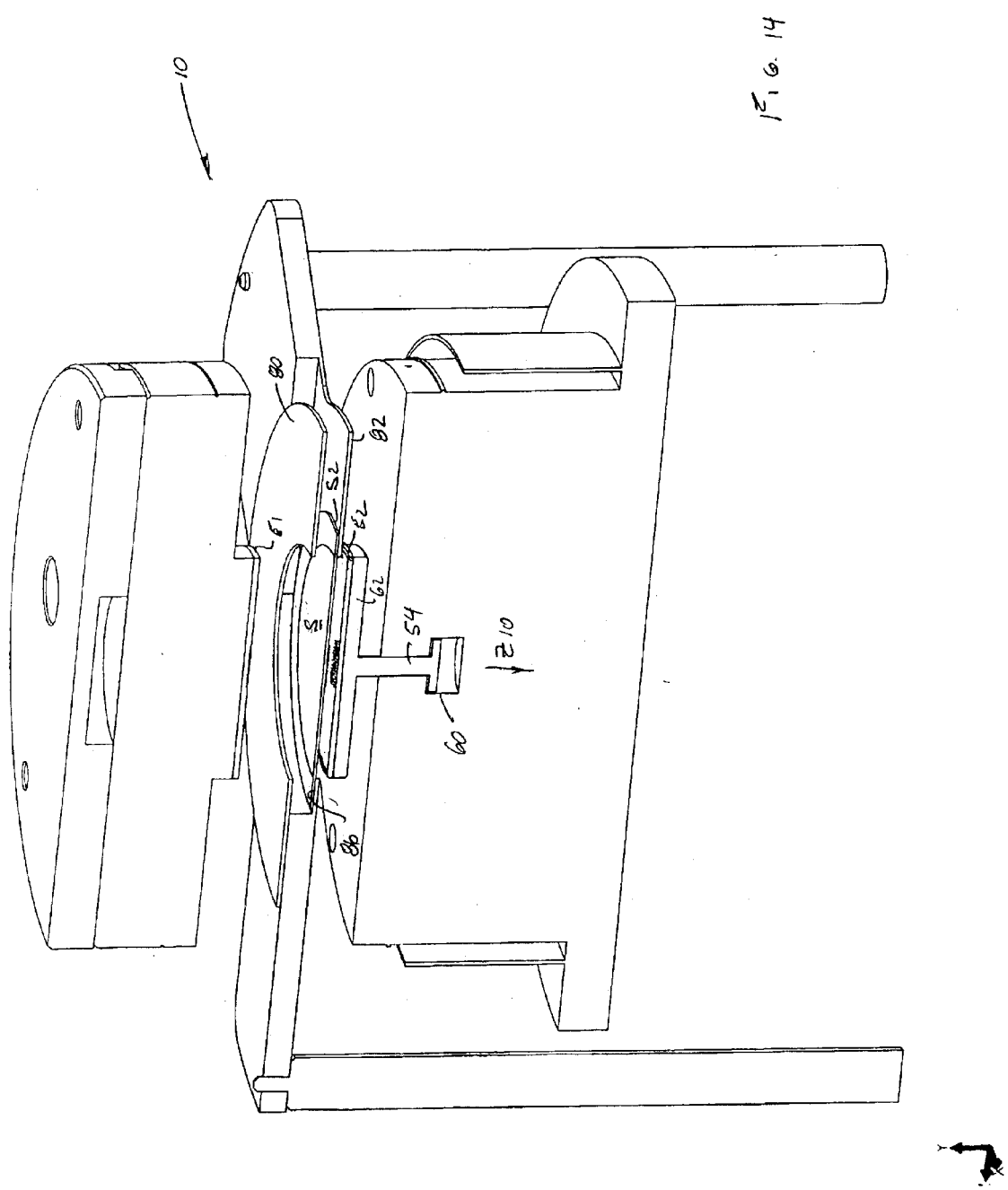

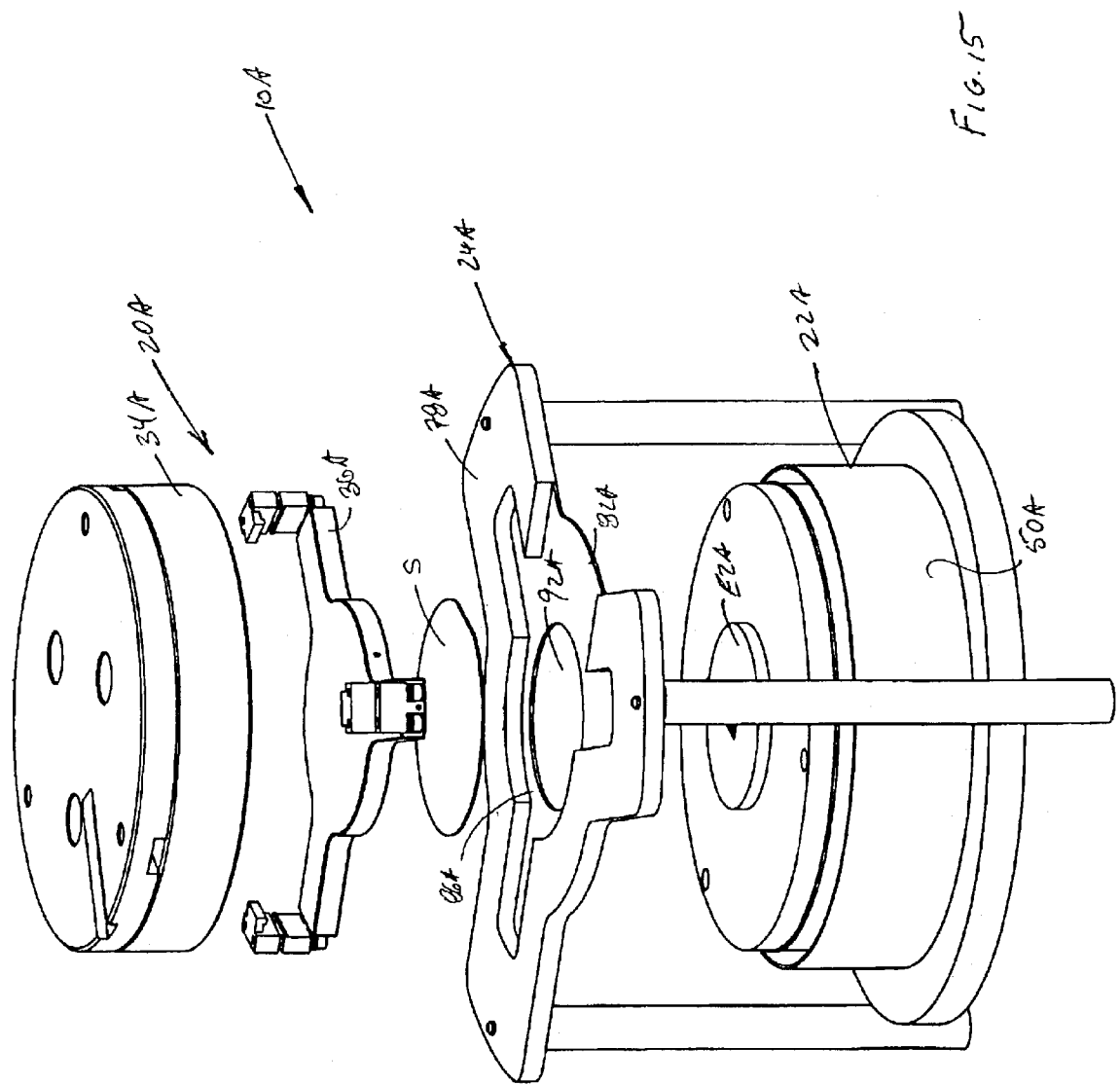

NANOIMPRINTING APPARATUS AND METHOD

BACKGROUND OF THE INVENTION

1. Field of the Invention

The present invention relates to nanostructure formation tools and, more particularly, to a nanoimprinting apparatus.

2. Description of Related Developments

Consumers continue to express a desire for ever more sophisticated electrical and electronic devices. However, though consumers expect the devices to have more memory, more features, faster processing and an even smaller size than earlier devices, they are unwilling to accept price increases for the devices. This has fueled a demand for mass-production of integrated circuits (IC) with smaller circuit features. For example, there is currently a demand for IC's with sub-50NM structures. Nevertheless, conventional lithography processes have proven to be unable to produce sub-50NM structures in a cost effective manner. For example, electron beam lithography has been used to generate structures in the scale of 10NM, but electron beam lithography is costly. Nanoimprinting techniques have been demonstrated to efficiently produce patterns with sub-25NM features. One example of a conventional nanoimprinting process is disclosed in U.S. Pat. No. 5,772,905, issued Jun. 30, 1998. Generally, this process involves having a mold with a pattern therein, that is pressed into a thin film carried on substrate. As can be realized, the pattern on the mold is thus used to mold a complementing pattern on the substrate, and hence the mold pattern itself has substantially the "opposite" profile than the desired pattern formed on the substrate. The nanoimprinting process has also proven successful in fabrication of micro electro-mechanical systems (MEMS). These devices have potential for use in numerous applications such as biomedical, biofluidics, microoptics, and nanotechnology applications.

Generally, nanoimprinting involves one of two processes; micro-contact printing, and hot embossing. The micro-contact printing is generally performed at room temperature and employs low contact forces in the order of about 100N. The hot embossing process is performed in an apparatus capable of generating and maintaining elevated temperatures. Further, hot embossing employs high contact forces approximately an order of magnitude larger than the forces used in micro-contact printing. Hot embossing includes at least two basic steps. The first is that the thin polymer film on a substrate is embossed with an embossing die or mold to form the nanostructure in the film. The second step is that ultimately, the embossing mold and film are separated. FIG. 1 is a schematic elevation view of a conventional hot embossing apparatus 1. The apparatus includes a top heater 2, a bottom heater 4, and a stamp or embossing mold 6. The apparatus operates generally as a hot press. The stamp 6 is connected to the bottom heater 4 which heats and maintains the stamp temperature at a desired level. The stamp 6 and bottom heater may be fixed or movable. The top heater 2 is movable in the direction indicated by arrow 7 relative to the stamp 6. The substrate S as seen in FIG. 1 is placed between the stamp 6 and top heater 2. The top heater is moved to press substrate S against the stamp 6 as shown, which effects formation of the nanostructure in the thin film on the substrate. As can be realized from FIG. 1, the step of separating the embossing stamp from the film on the substrate has presented difficulty in conventional hot embossing techniques. For example, in some conventional hot embossing systems a wedge or other prying tool is inserted manually, in a lateral direction between mold and film, in order to effect separation therebetween. As it acquires purchase under the mold, the wedge or prying tool is forced over and against the thin film on the substrate which may result in disruption or damage to the very nanostructure formed by applying the mold. Further, due to the direction in which the wedge or prying tool is applied, control of the forces applied against the substrate is difficult which may result in breakage and total loss of the substrate. In view of the number of IC or MEMS devices that may be formed on a substrate, the cost for loss of a single substrate may be significant. The present invention overcomes the problems of conventional hot embossing systems as will be described in greater detail below.

SUMMARY OF THE INVENTION

In accordance with an embodiment of the present invention, a nanoimprinting apparatus for imprinting nanostructure on a workpiece is provided. The apparatus comprises a frame, a platen, an embossing tool, and a separating tool. The platen is connected to the frame for supporting the workpiece. The embossing tool is connected to the frame for imprinting the nanostructure on the workpiece. The separating tool is connected to the frame for separating the workpiece and embossing tool. The separating tool has a workpiece engagement surface for engaging the workpiece when separating the workpiece and embossing tool. The embossing tool extends through the separating tool.

In accordance with a method of the present invention, a method for imprinting nanostructure on a workpiece is provided. The method comprises providing a press having a platen, an embossing tool and a separating tool. The method further comprises providing the separating tool with an opening formed therein, placing the workpiece on the platen, moving the embossing tool through the opening and the separating tool, and separating the workpiece and embossing tool. The embossing tool is moved through the opening in the separating tool to contact the workpiece. The workpiece and embossing tool are separated with the separating tool. The separating tool engages the workpiece and effects separation between the workpiece and embossing tool.

BRIEF DESCRIPTION OF THE DRAWINGS

The foregoing aspects and other features of the present invention are explained in the following description, taken in connection with the accompanying drawings, wherein:

FIG. 2 is a cross-sectional perspective view of a nanoimprinting lithography apparatus incorporating features of the present invention, and an embossing assembly used with the apparatus;

FIG. 2A is an enlarged portion of the cross-section shown in FIG. 2;

DETAILED DESCRIPTION OF THE PREFERRED EMBODIMENT

Figure 1:
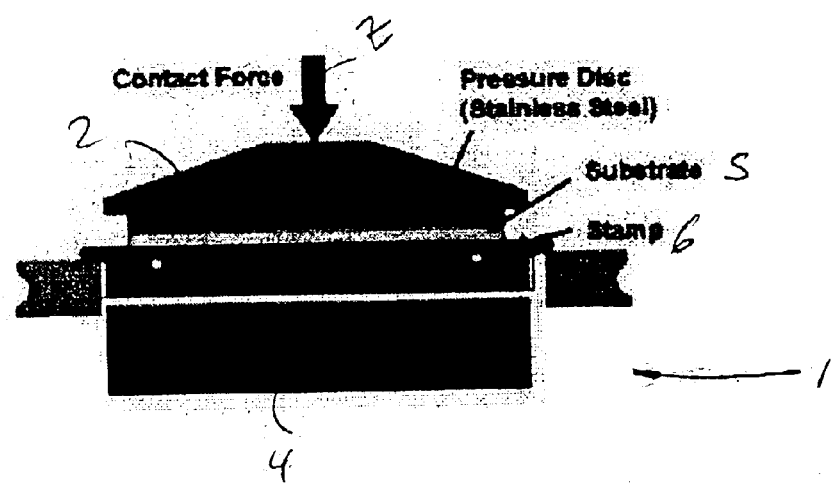
FIG. 1 is a schematic cross-sectional view of a hot embossing apparatus in accordance with the prior art.
Figure 6:
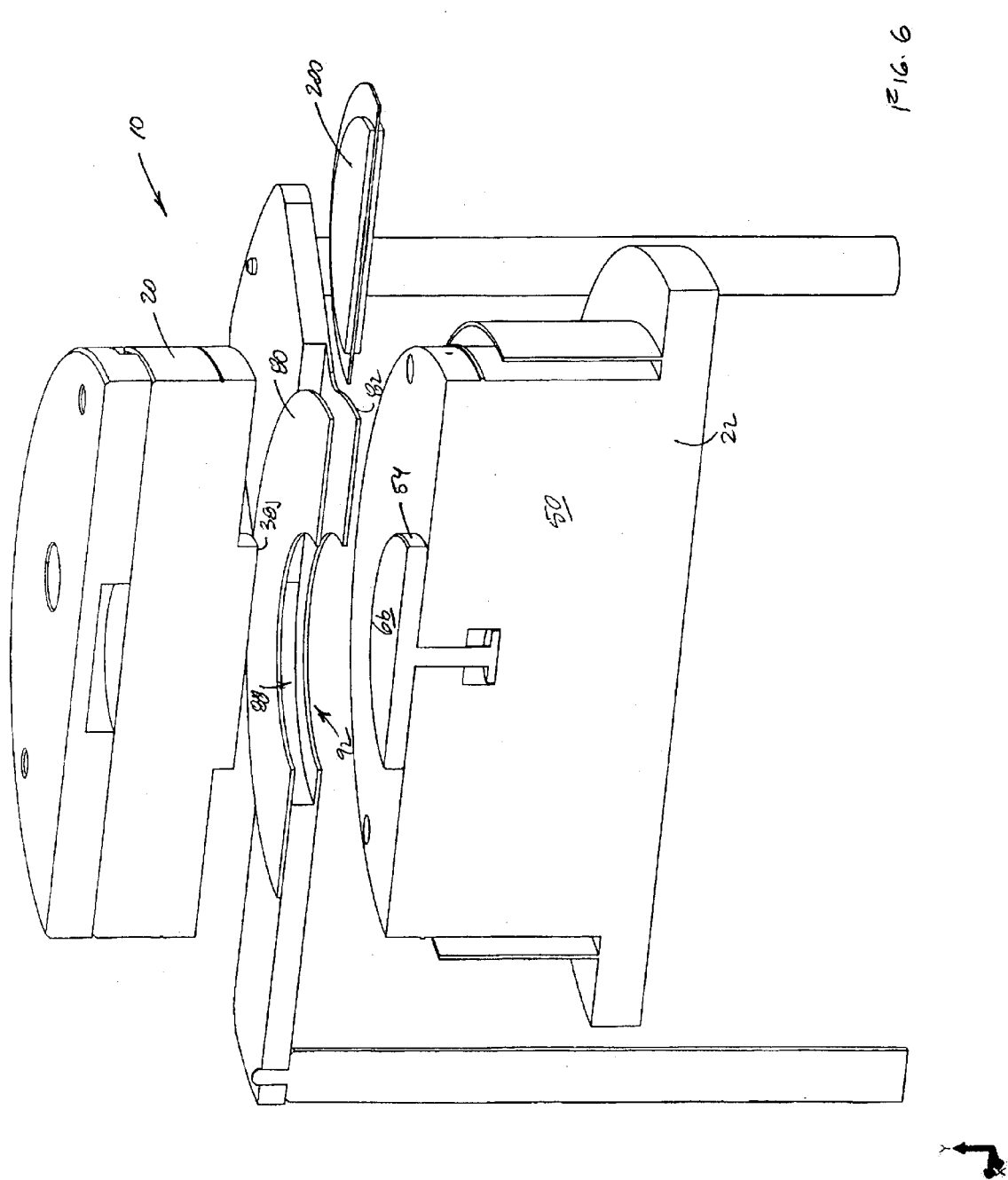
FIG. 6 is a partial cross-sectional perspective view of the apparatus in FIG. 1, showing the apparatus in a first position with the embossing assembly located before placement into the apparatus.

Referring to FIG. 2, there is shown a cross-sectional perspective view of a nanoimprinting lithography apparatus 10 incorporating features of the present invention and an embossing assembly 200 used with the apparatus. Although the present invention will be described with reference to the single embodiment shown in the drawings, it should be understood that the present invention can be embodied in many alternate forms of embodiments. In addition, any suitable size, shape or type of elements or materials could be used.

Still referring to FIG. 2, the nanoimprinting lithography apparatus 10 in this embodiment includes a chamber or housing 12 where the lithography process is performed. The chamber may contain any suitable atmosphere, such as an inert gas, or may be held at vacuum conditions as desired. In alternate embodiments, the lithography apparatus need not include a chamber. The chamber 12 may include an access port 14 through which workpieces, such as semiconductor substrates or any other suitable lightographic workpieces, may be transported into and out of the chamber. If desired, the access port 14 may have a door (not shown). A substrate transport device 106, which may be automated or otherwise manually operated, may be used to move substrates into and out of the chamber. The nanoimprinting lithography apparatus 10 generally includes an upper embossing assembly 20, and a lower embossing assembly 22. The upper embossing assembly 20 and lower embossing 22 assembly are movable, at least with respect to each other. The upper and lower embossing assemblies are also heated in this embodiment. A controller 100 is operably connected to the upper and lower assemblies 20, 22 to control the relative movement between assembly and the temperature of the assemblies. The apparatus also includes a deembossing or separating section 24. To accomplish the nanoimprinting lithography, a substrate S, coated with a thin polymer film, is brought into the chamber 12, for example by transporting the substrate S with transport apparatus 16 through port 14. The upper and lower embossing assemblies 20, 22 are closed to emboss the thin film on the substrate S. The separating section 24 separates the substrate S from the upper and lower embossing tools as will be described in greater detail below. The separating section 24 effects separation between substrates S and embossing tools in a controlled manner, thereby preventing disturbance and damage to the nanoimprinted structures on the substrate or to the substrate itself.

Figure 3:
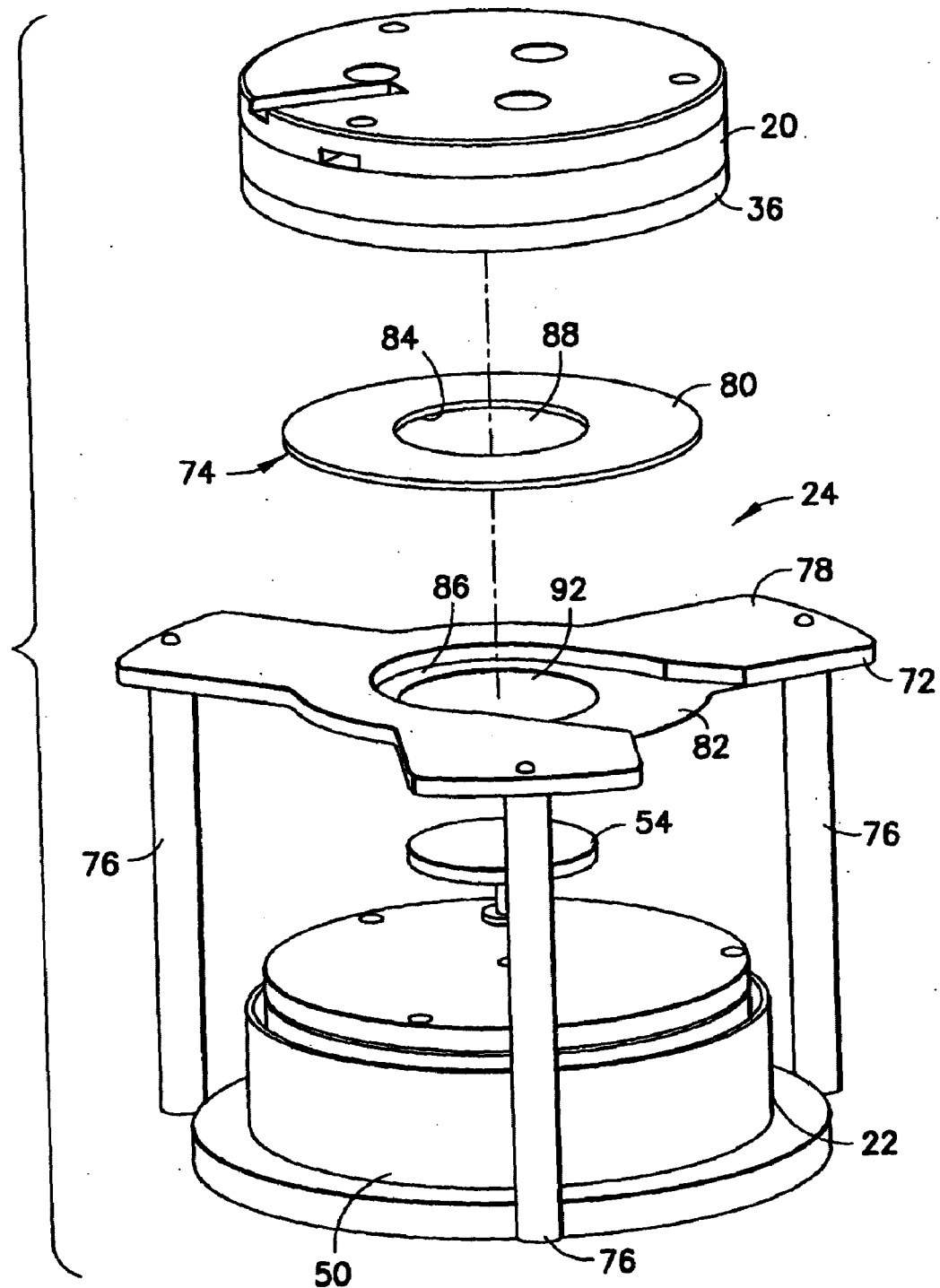
FIG. 3 is an exploded perspective view of the nanoimprinting lithography apparatus in FIG. 2.

In greater detail now, and referring also to FIG. 3, the upper embossing assembly 20 generally comprises a support section 26 and a head section 28. The support section 26 connects the upper embossing assembly 20 to the chamber structure 12. The head section 28 is supported from the support section. The support section 26 may include a shaft or any other suitable support structure 30 for mounting the embossing assembly 20 to the chamber structure. In this embodiment the upper embossing assembly 20 is movable relative to the chamber, and hence, the shaft 30 is mated to suitable motive means 32 to move the assembly 20 back and forth in the direction indicated by arrow Z1 in FIG. 2. The motive means 30 may include any suitable actuator or linear drive mechanism such as for example, a hydraulic, pneumatic, or electro-mechanical actuator, or a linear drive motor. Also, the shaft 30 and chamber structure may be provided with a suitable interface to allow travel of the upper embossing assembly inside the chamber. As noted before, in alternate embodiments the upper embossing assembly may be fixed in the chamber. As seen in FIG. 2, the head section 28 of the upper embossing assembly has a head member 34 and a heater 36. The head member 34 operates as a heat insulation block, and may be made of ceramic or other suitable material. The insulator section may be used to isolate the head section from the support section 26 to avoid any detrimental heat transmission from the head section to the support section structure. The heater 36 may include any suitable heating elements (not shown) disposed in a heater housing 37. The heating elements may be electrical heating elements such as induction heating coils, or resistive heating coils, though any other suitable heating elements may be used including thermal passages through which a thermal medium is passed. The heater 36 is mounted, as shown in FIG. 2, to the bottom of the head member 34. The upper surface of the heater casing is seated against the lower surface of the head member 34. In alternate embodiments, the heater may be located in any other suitable manner, or may be incorporated directly into part of the head member. In this embodiment, the lower surface 38 of the heater casing has a platen or seating surface 38S. As seen in FIG. 2, in this embodiment the lower surface 38 of the heater housing is shaped to form a projecting portion 40. As will be described in greater detail below, the projecting portion 40 is sized and shaped to be admitted through an opening in the separating section 24. The bottom of the projecting portion 40 forms the seating surface 38S. If desired, the seating surface 38S may be provided with embossing features (not shown) for embossing nanostructures into the thin film on substrate S. Otherwise, the seating surface may be substantially flat. The seating surface 38S may also have a capture system 42 for attaching an embossing tool to the upper embossing assembly. The capture system may be for example, a vacuum retention system with suction ports (not shown) formed in the seating surface 38S. The suction ports, may be connected to a vacuum pump via suitable lines that may be routed in any suitable manner to the suction ports. In alternate embodiments, the capture system may be an electro-mechanical system or any other suitable system operating grippers or clamps capable of capturing an holding and embossing tool on the seating surface of the upper embossing assembly. In still other alternate embodiments, the seating surface may be provided with fastener holes, so that the embossing tool may be mechanically fastened to the seating surface. In yet other alternate embodiments, the bottom surface of the heater casing may be flat.

Still referring to FIGS. 2 and 3, the lower embossing assembly 22 generally includes a support section 44 and a head section 46. The support section 44 of the lower embossing assembly 22 is generally similar to the support section 26 of the upper embossing assembly 20 described before. In this embodiment, the support section 44 includes a shaft 48, that is movably connected to the chamber structure to allow the lower embossing assembly to move freely relative to the chamber (in the direction indicated by arrow Z2 in FIG. 2). The shaft 48 may be mated to any suitable linear drive actuator or motor (not shown). As is the case, with the upper embossing assembly 20, movement of the shaft 48 of the lower assembly is controlled by controller 100. The controller is communicably connected to the actuator or drive powering the shaft to control both direction and travel of the shaft 48. Suitable instrumentation, such as for example, linear displacement transducers, may be arrayed as desired on the shaft, lower embossing assembly, and drive/actuator to precisely (within a tolerance range used in nanoimprinting lithography) establish the position of the lower embossing assembly 22.

The head section 46 of the lower embossing assembly 22 has a heater section 50, an interface section 52 and a movable stage 54. The movable stage 54 is mounted to the heater section 50 as will be described further below. The interface section 52 mounts the heater section 50 to the support section 44. In alternate embodiments, the heater section may be directly coupled to the support section. The heater section 50, generally includes a casing 56 with any suitable number of heating elements arrayed inside the casing to generate a desired temperature profile on the surface of the casing. Similar to the heater 36 in the upper assembly, any suitable heating elements (not shown) may be used in heater section 50. The heating elements are operated by controller 100 as is the case with the elements in heater 36. Suitable temperature sensing instrumentation (not shown) is mounted on both heater section 50 and heater 36, and communicably connected to the controller 100 to allow the controller 100 to regulate the temperature and heat output of the heater section 50 and heater 36 in a precise manner. As seen best in FIG. 2A, the heater section 50 of the lower embossing assembly 22 has coupling means 58 for movably mounting movable stage 54 to the heater section 50. In this embodiment, coupling 58 includes a cavity or socket 60 formed into the heater section 46 as shown in FIG. 2. The socket 60 has an opening in the upper face 51 of the heater section. The socket 60 includes an upper portion 60A and a lower portion 60B that is wider than portion 60A. The shoulder 60S defined at the interface between portions 60A and 60B of the socket form a stop in the socket as will be described further below. In alternate embodiments, the coupling means for mounting the movable stage to the lower embossing assembly may have any other suitable configuration, and may depend from any suitable portion of the lower embossing assembly.

The movable stage 54, as seen in FIG. 2, has an upper platform 62 and a coupling section 64. The upper platform 62 has a platform or seating surface 66 oriented to allow the substrate S to be seated therein when the substrate is in the apparatus 10. The peripheral edge of the seating surface 64 is sized and shaped to be admitted through an opening in the separating section 24 as will be described further below. The coupling section 64 generally complements the socket 60 in the heater section. Accordingly, in this embodiment the coupling section 64 includes a post 68 depending from the upper section 62 (see also enlarged cross-sectional view in FIG. 2A). The post 68 has a stop 70 located thereon. In this embodiment the stop 70 is at the bottom of post 68, though in alternate embodiments the stop may be positioned at any suitable location on the post. In this embodiment, the post 68 conforms to the shape and size of the upper section 60A of the socket 60 to form a precise sliding fit. The length of the socket upper section 60A and post 68 may be selected as desired to minimize lateral play of the movable stage 54. Stop 70 is sized to be admitted into the lower part 60B of the socket 60 and stops upward travel of the post 68 when abutting socket stop 60S, and downward travel when making contact with the end 60E of socket 60 (See FIG. 2A). Hence, the movable stage 54 is able to move freely relative to the heater section 50 (in the direction indicated by arrow Z2 in FIG. 2) until stop 70 abuts socket stop 60S or socket end 60E. The coupling between the movable stage 54 and heater section 50 operates to dampen the motion between the stage and heater sections in order to prevent impact loads and promote smooth motion. In alternate embodiments, the lower embossing assembly may have a fixed embossing tool mounted to the upper face of heater section in place of the movable stage (see for example FIG. 15). The embossing tool may have an upper embossing surface oriented to contact and emboss the nanostructure in the thin film of the substrate S. The embossing surface of the embossing tool may be sized similar to the seating surface 66 of the movable stage to allow the embossing surface to pass through an opening in the separating section 24. In the embodiment shown in FIG. 2, the movable stage seating surface 66 is substantially flat and may not be provided with an embossing pattern.

Figure 4A:
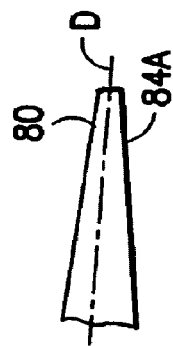
FIG. 4A is a partial cross-sectional view of a separating member of the apparatus.
Figure 4:
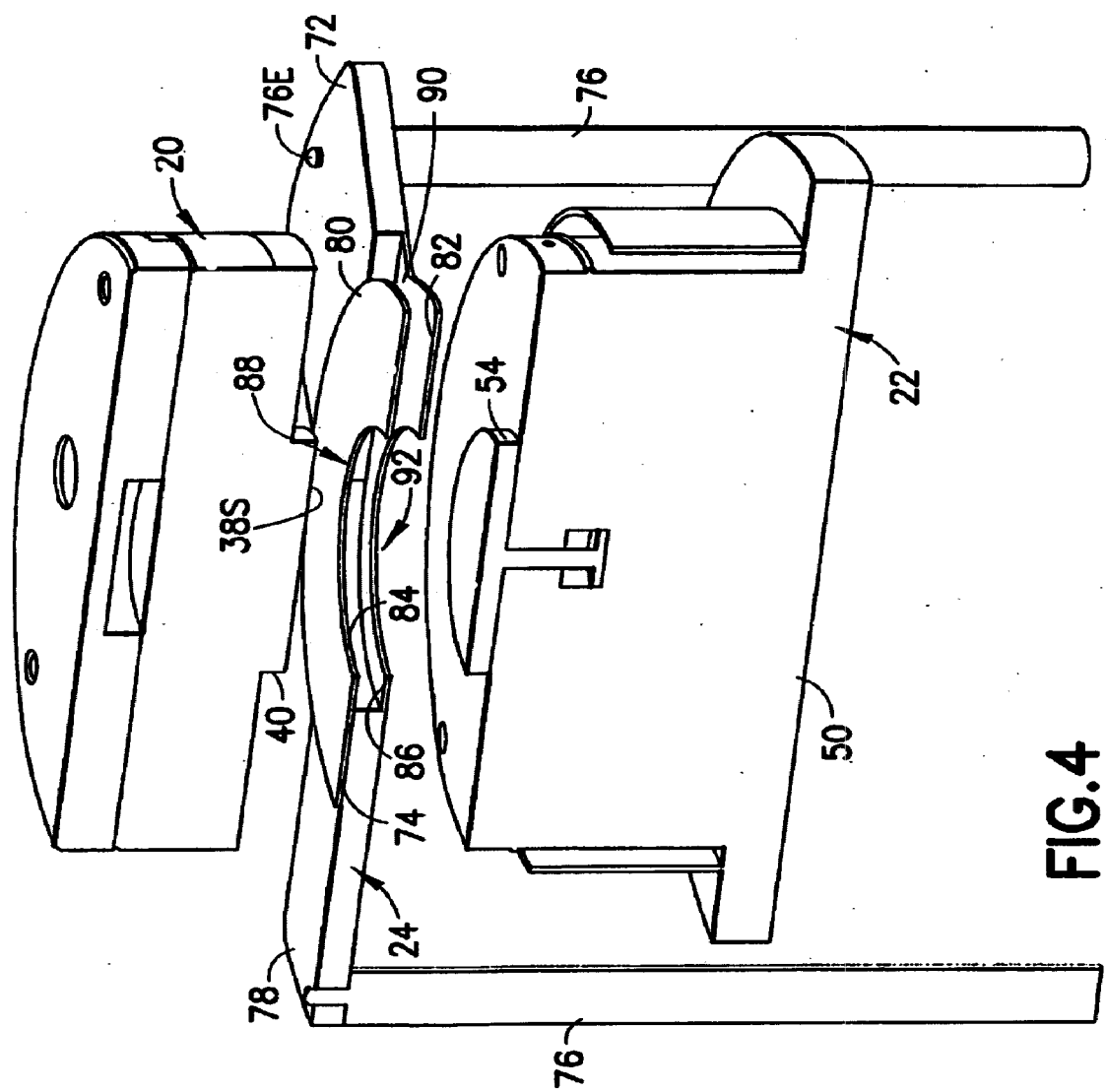
FIG. 4 is a partial cross-sectional perspective view of the apparatus in FIG. 1 showing the apparatus in a first position.

The separating section 24 of the apparatus is seen best in FIGS. 3 and 4, which show respectively an exploded perspective and a partial cross-sectional perspective view of the upper embossing assembly 20, the lower embossing assembly 22 and the separating section 24 (the chamber structure is not shown for clarity). The separating section 24 generally comprises a support section 72 and a de-embossing section 74. In this embodiment, the separating section 24 of the embossing apparatus is generally static, and hence separation between the substrate and embossing tool is effected substantially by movement of the upper and lower embossing assemblies. In alternate embodiments, the separating section may be movable at least in part relative to either embossing assembly in the chamber structure. The structure of the support section 72 shown in FIG. 4 is exemplary, and the separating section 24 of the apparatus 10 may have any suitable type of support structure. In this embodiment, the support section 72 may include support posts 76 (only three posts 76 are shown in FIG. 3 for example purposes, but any desired number of support posts may be used). The posts 76 are shown in FIG. 2 as being supported from the bottom of the chamber, but in alternate embodiments, the support posts may be suspended from the top or any other portion of the chamber. The length of the posts 76 may be adjustable to position one end 76E of the posts as desired. As seen in FIG. 4, the support section 72 includes a span 78 which spans between the posts 76. The span 78 may be made of plate material or may have any other suitable section. The span 78 extends between the upper and lower embossing assemblies 20, 22 as shown in FIG. 4. The de-embossing section 7 is mounted to the span 78.

As seen in FIG. 4, the de-embossing section generally comprises a pair of separating members 80, 82 located substantially one over the other. The separating members 80, 82 respectively define a pair of opposing engagement surfaces 84, 86 for engaging a portion of the substrate (as will be described further below) during de-embossing. In this embodiment, the upper separating member 80 is formed from a plate of any suitable material. The plate may be provided with a flat lower surface. Otherwise, in accordance with the embodiment shown in FIG. 4A, the lower surface 84A of the plate making up the separating member 80 may be pitched relative to a datum surface D of the member 80 (the pitch of surface 84A in FIG. 4A is exaggerated for example purposes). A hole 88 is formed in the plate. The hole 88 is sized, as noted before, to allow portion 40 of the heater casing having seating surface 38S to enter in the hole 88. As can be realized, the upper engagement member 80 thus has a general ring shape, though the outer perimeter of the member may not be round in shape. The upper member 80 may be mounted to span 78 by any suitable means including material displacement bonding, chemical bonding, or mechanical fastening. In the case where the lower plate surface is flat, the member may be placed on a flat horizontal surface of the span 78. In the embodiment shown in FIG. 4A, where the lower surface is pitched, the member is positioned so that datum D is aligned horizontally. This results in the lower surface, and hence in the engagement surface 84A of the member 80 being angled relative to the horizontal plane. In alternate embodiments, the upper separating member may be integrally formed into the span by forming an inwardly projecting upper flange around a hole (similar to hole 88) in the span.

The lower separating member 82 in this embodiment may be integrally into the span. As seen in FIG. 4, the span plate 78 has an inner section 90 of reduced thickness. A hole 92 is formed in the inner section. The hole 92 is aligned with the movable stage 54 of the lower embossing assembly 22, and is sized to allow entry of the movable stage 54 into the hole. The upper surface of the inner section 90 around hole 92 forms engagement surface 86. Similar to opposing engagement surface 84, engagement surface 86 may be substantially flat and generally parallel to a horizontal plane. In other embodiments, the lower engagement surface may be pitched relative to the horizontal plane in a mirror image of the incline of surface 84A in FIG. 4A. In alternate embodiments, the lower separating member may not be one piece with the span, and may be, for example similar to upper member 80, a separate member formed from plate or other suitable section and assembled or mounted to the span. In other alternate embodiments, the engagement surfaces may not extend, unlike embodiment shown in FIG. 4, continuously around the perimeter of the holes in the upper and lower separating members.

Figure 5:
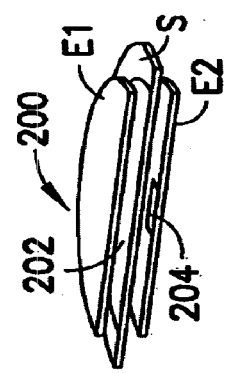
FIG. 5 is an exploded perspective view of the embossing assembly used with the nanoimprinting apparatus.

Referring now to FIG. 5, there is shown a cross-sectional perspective view of an assembly 200 capable of being used with the embossing apparatus 10 in FIG. 2. The assembly 200 includes a substrate S and embossing tools E1, E2. The substrate S in this embodiment may be coated on opposing sides with a suitable thin polymer film used for nanoimprinting lithography. The substrate S, may have an existing layer of nanoimprinted structure thereon, or may be devoid of any such structure. In the case where the substrate S has pre-printed nanostructure on one or both sides of the substrate, the embossing tools E1, E2 may be used to superimprint nanostructure in thin films deposited over the pre-imprinted nanostructure of the substrate. As seen in FIG. 5, each embossing tool E1, E2 has embossing structure 202, 204 formed thereon. The embossing tools E1, E2 and substrate S are aligned to each other using suitable aligning apparatus, such as the Suss MicroTec Bond Aligner and are mated together. The adhesive properties of the thin film deposited on the substrate S may provide adequate bonding forces to maintain an integral assembly during subsequent handling and embossing. In addition, a clamping system (not shown) may be used to hold the tools E1, E2 and substrate assembled together. The assembly 200 may be used for simultaneously embossing nanostructure on opposite sides of the substrate S. In alternate embodiments, the assembly may include only one embossing tool on one side of the substrate S. The embossing tools E1, E2 are sized and shaped so that the respective tools will pass through the corresponding openings 88, 92 in the upper and lower separating members 80, 82 (see FIG. 4).

Figure 7:
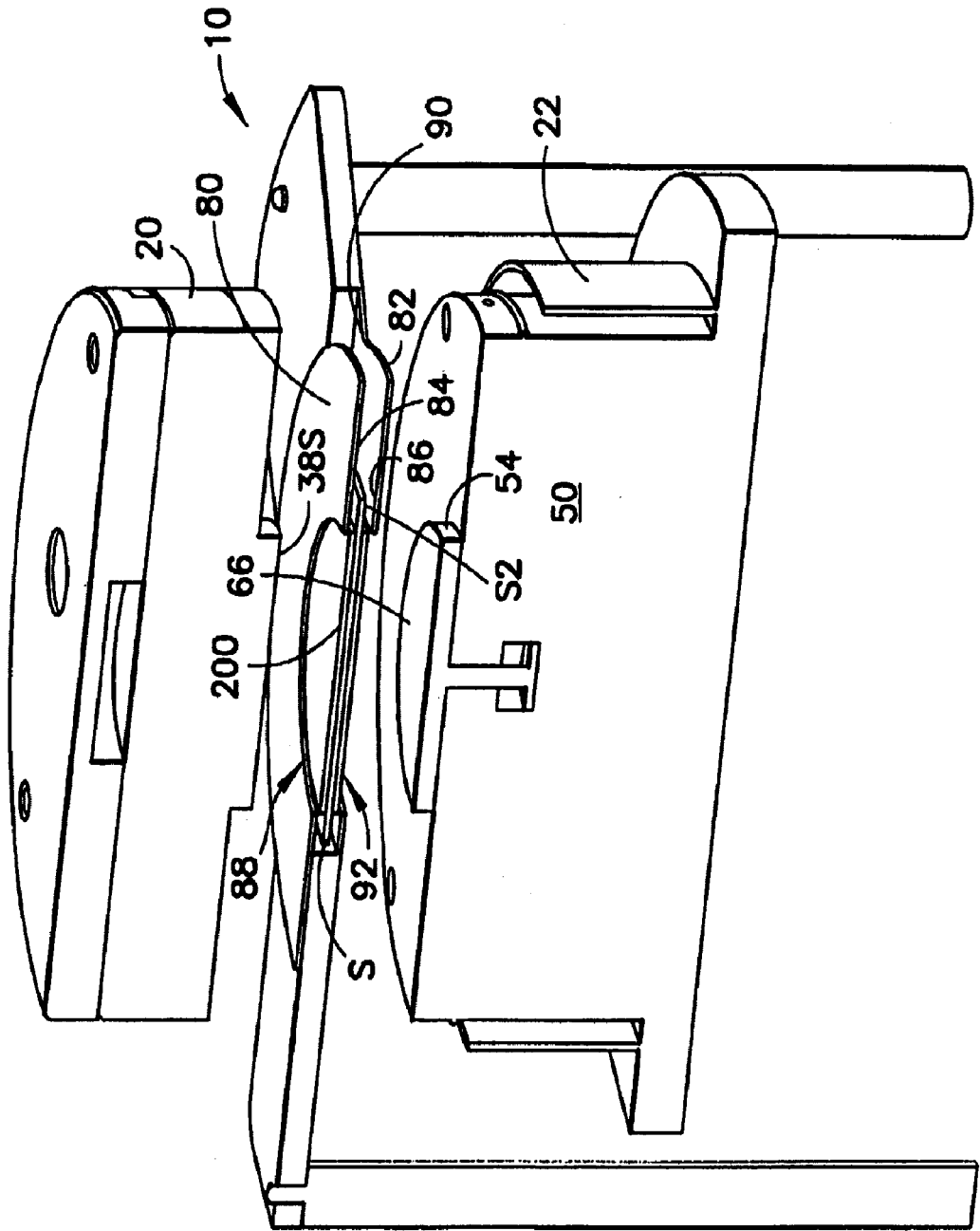
FIG. 7 is another partial cross-sectional perspective view showing the apparatus in the position shown in FIG. 4 with the embossing assembly located in the apparatus.

Referring now to FIG., 6 the embossing apparatus 10 (the chamber structure 12 is omitted in FIGS. 6-13 for clarity) is shown with the upper and lower embossing assemblies located in a first position such as may exist at the start of an embossing sequence. The assembly 200 is moved into the apparatus 10, for example using transporter 106 shown in FIG. 2. FIG. 7 shows the assembly 200 positioned in the apparatus 10 at a time before starting the embossing process. As seen in FIG. 7, assembly 200 is located between the separating members 80, 82. The embossing tools E1, E2 (see FIG. 5) of the assembly 200 are aligned respectively with the facing holes 88, 92 in the separating members. As can be seen in FIG. 7, alignment between the embossing tools and corresponding openings 88, 92 also provides general alignment with the facing seating surfaces 38S, 66 of the upper and lower embossing assemblies 20, 22. The substrate S of assembly 200 extends beyond the exterior edges of the embossing tools as well as the edges of the holes 88, 92 in the separating members 80, 82. Accordingly, the outer portion of substrate S overlaps the engagement surfaces 84, 86 of the separating members 80, 82 around the perimeter of holes 88, 92 in the separating members. At the start of the embossing process, the assembly 200 may be positioned as shown in FIG. 7, the assembly 200 being supported by suitable structure (not shown) in the intermediate position shown between the separating members. In an alternate embodiment, the transport apparatus may be used to position the assembly with the lower surface S2, of the substrate S resting against the upper surface 90 of the lower separating member (the lower embossing tool E2 would be located in the lower hole 92).

Figure 8:
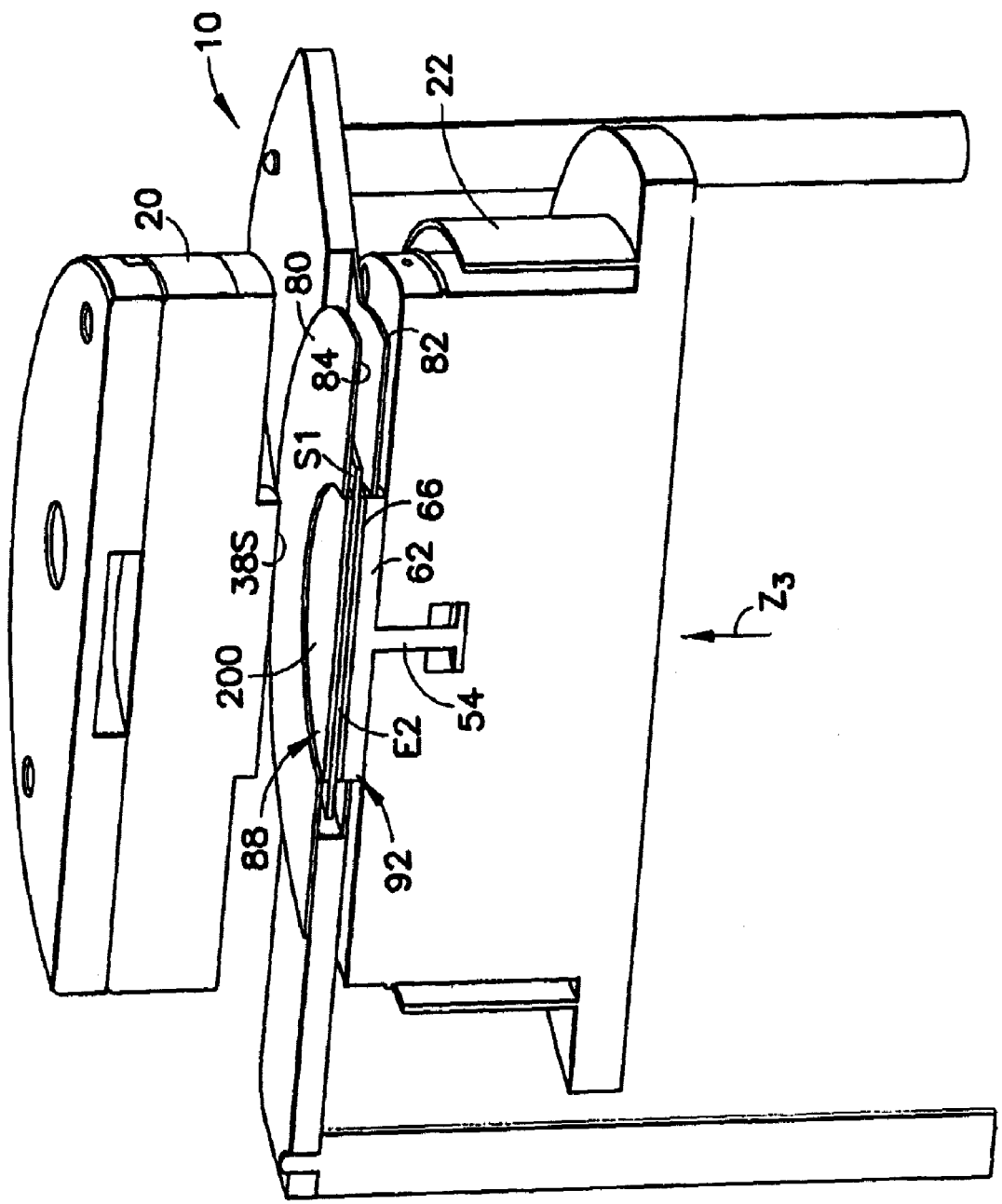

Referring to FIG. 8, the lower embossing assembly 22 is shown in another position during the embossing process. Relative to the position shown in FIG. 7, assembly 22 has been moved in the direction indicated by arrow Z3. The upper platform 62 of movable stage 54 has entered opening 92 in the separating member 82, and the seating surface 66 contacts the bottom of embossing tool E2 in assembly 200. After contact between the seating surface 66 and embossing tool E2, the lower assembly 22 continues to move in the Z3 direction thereby raising assembly 200 towards upper separating member 80. Travel of the lower embossing assembly 22, is, as noted before, controlled by processor 100 (see FIG. 2) and stopped in the position shown in FIG. 8 when the upper surface S1 of the substrate is at a desired standoff from engagement surface 84. Prior to moving the lower embossing assembly 22 to contact assembly 200, and indeed possibly before placement of assembly 200 into the apparatus 10 as shown in FIG. 7, the desired temperature of the upper and lower assemblies 20, 22, and in particular of the respective seating surfaces 38S, 66 is established by controller 100. After the embossing tool E2 is seated against surface 66, embossing tool capture means (not shown), such as for example vacuum draw down or any clamps may be used to secure embossing tool E2 to stage 54.

Figure 9:
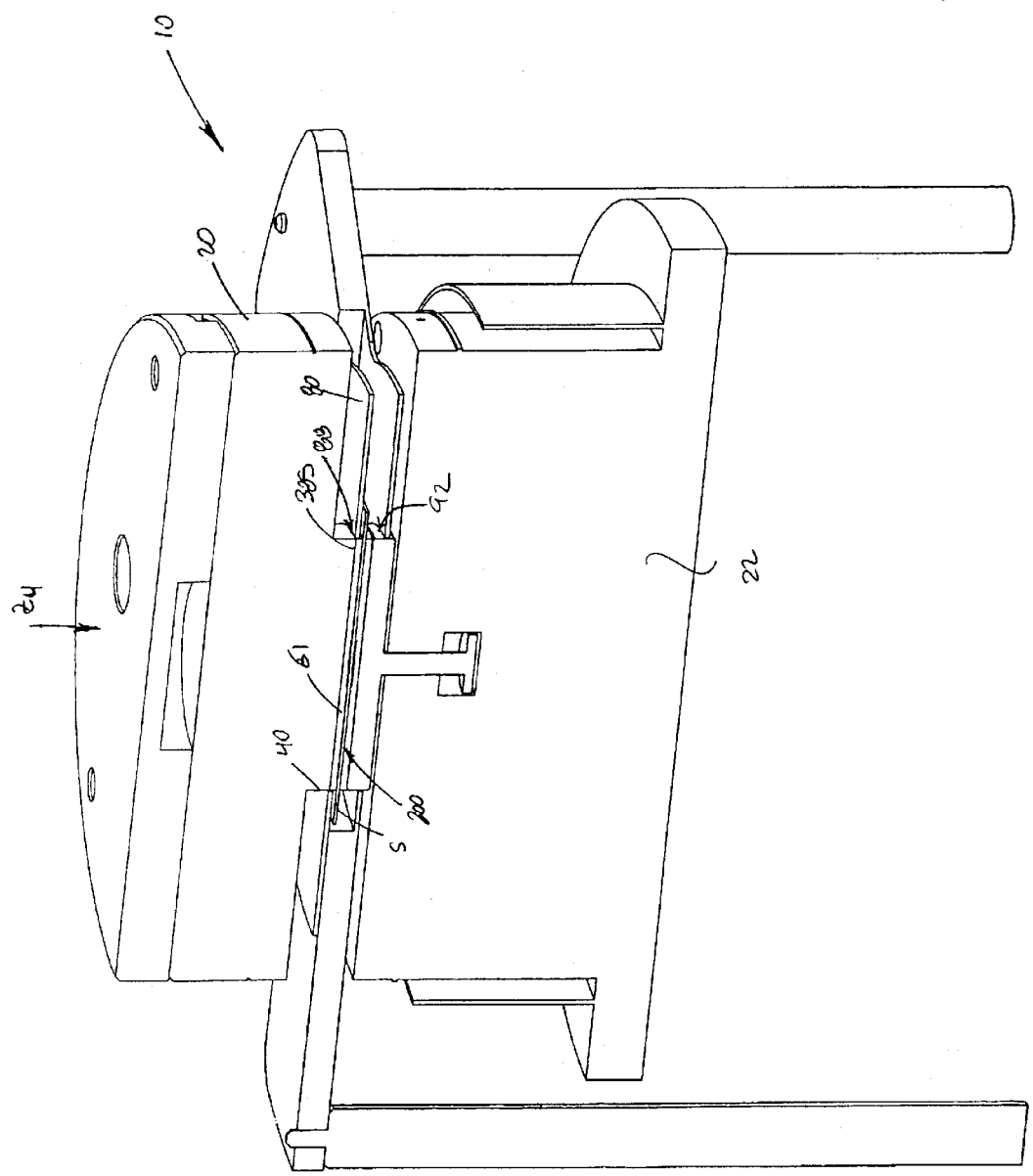
FIGS. 8-9 are respectively other partial cross-sectional perspective views showing the apparatus in different positions during embossing of a substrate S.
Figure 13:
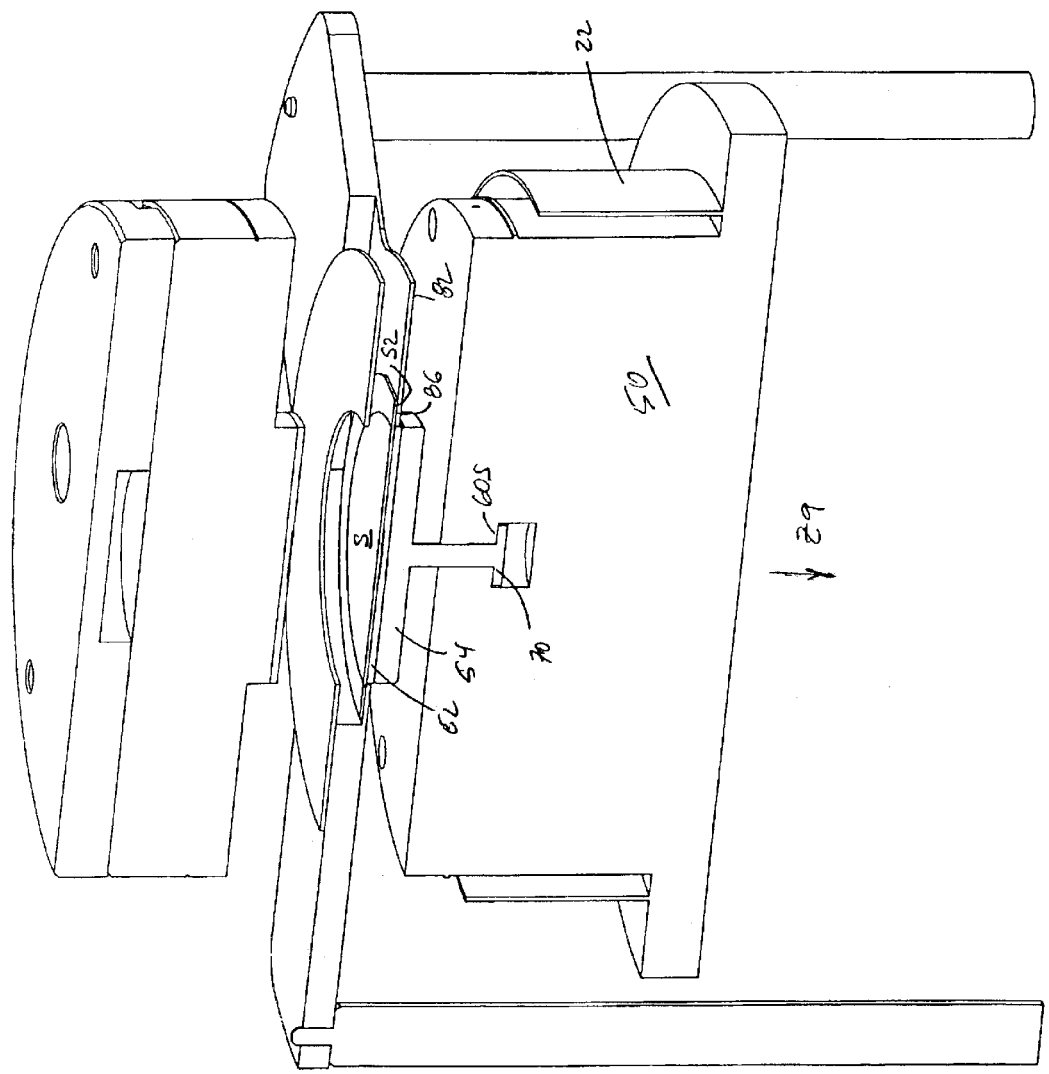
FIGS. 12-14 are respectively yet other partial cross-sectional perspective views showing the apparatus in further different positions during deembossing of another side of the substrate S.
Figure 1:
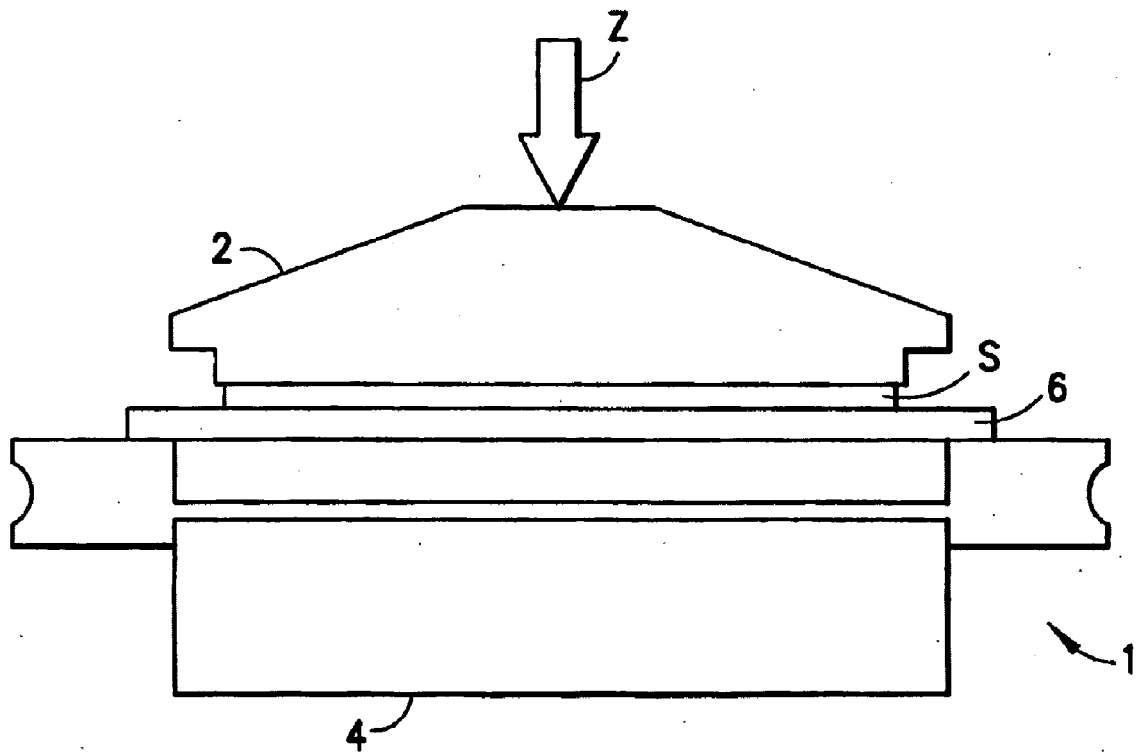

FIG. 9 shows the apparatus 10 in another configuration, wherein the upper embossing assembly 20 is moved in direction indicated by arrow Z4 to contact the assembly 200. In the position shown in FIG. 9, the seating surface 38S contacts embossing tool E1 in assembly 200. The projecting portion 40 of the heater casing extends into hole 88 of separating member 80. Embossing tool capture means of the upper embossing assembly, described previously, may be used to secure embossing tool E1 to the seating surface 38S. Accordingly, in the position shown in FIG. 8, the assembly 200 is attached to the upper and lower embossing assemblies 20, 22. The movement of the upper and lower assemblies 20, 22 to contact assembly 200, as shown in FIGS. 8 and 9 may be performed simultaneously or any desired order. Hence, in alternate embodiments, the upper and lower assemblies may be moved to contact assembly 200 in unison, or the upper assembly may be brought into contact before the lower assembly is moved. In the position shown in FIG. 9, the temperature of assembly 200 may be established, using the heater in the upper and lower embossing assemblies 20, 22 controlled by processor 100, as desired for nanoimprinting lithography. Pressure is applied on assembly 200 from upper and lower assemblies 20, 22 to emboss the pattern on embossing tools E1, E2 into the thin film on the opposite sides of the substrate S.

After imprinting the nanostructure on the substrate S, the embossing tools E1, E2 and substrate S are separated from each other.

Figure 10:
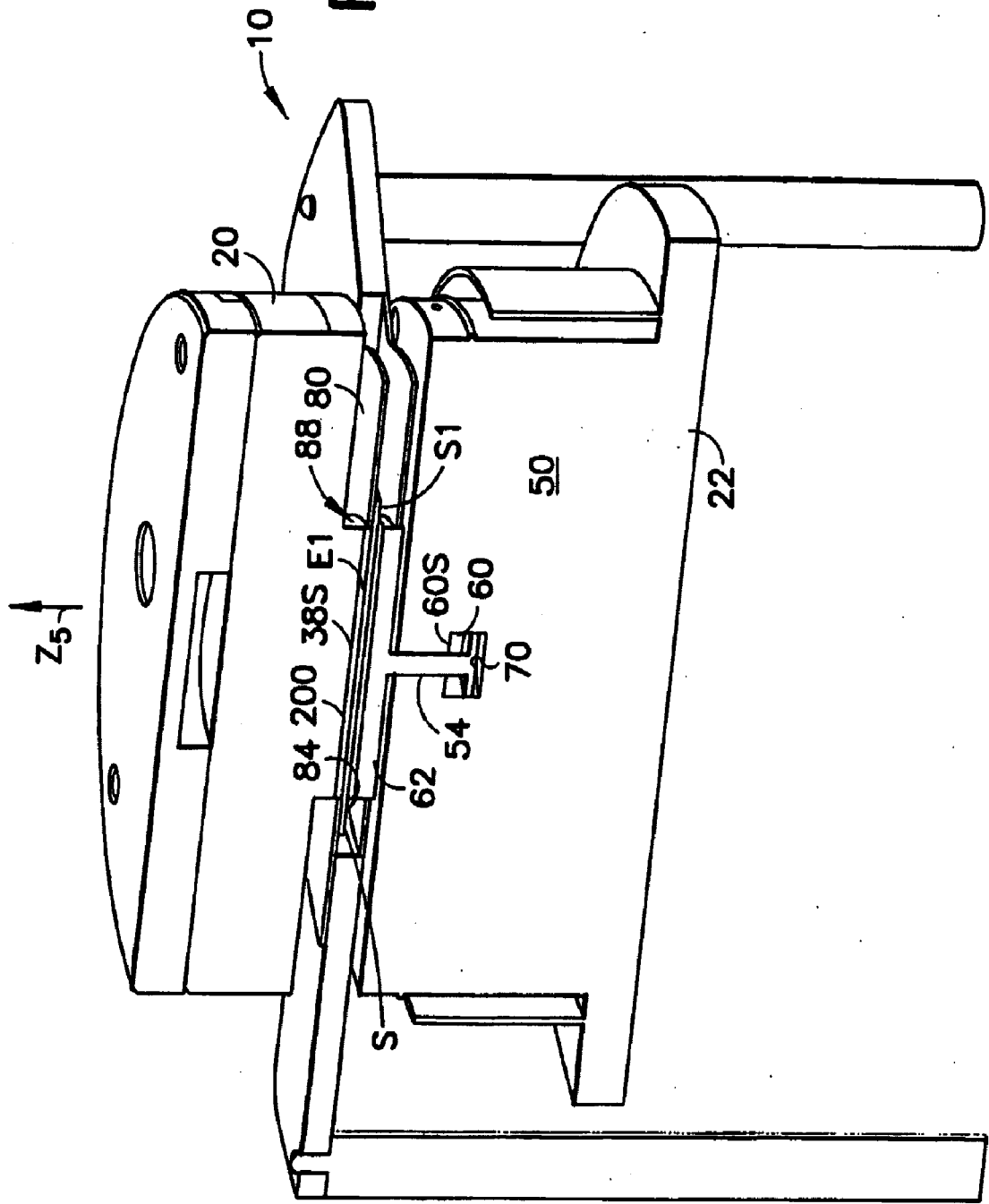
FIGS. 10-11 are respectively still other partial cross-sectional perspective views showing the apparatus in further different positions during deembossing of one side of the substrate S.

FIG. 10 shows the apparatus 10 with the upper and lower embossing assemblies in another position during de-embossing of tools E1, E2 and substrate S. In the position shown in FIG. 10, the upper embossing assembly 20 is moved in the direction indicated by arrow Z5. The movable stage 54, secured as described before to the assembly 200, moves relative to heater section 50 in direction Z5 with the upper embossing assembly 20. Otherwise, the lower embossing assembly 22 may not be moved. Upward movement of the upper embossing assembly 20, causes the upper surface S1 of substrate S to engage engagement surface 84 of upper separating member 80. The embossing tool E1, secured to the upper assembly 20 enters into hole 88 of the separating member 80. Engagement between the surface 84 of separating member 80 and surface S1 of the substrate S occurs around the perimeter of the embossing tool E1. This engagement, as the upper assembly 20 moves in direction Z5, results in a load being uniformly distributed around the perimeter of the substrate S to overcome the bond between tool E1 and substrate S. Separation occurs when the separation load from member 80 on substrate S exceeds the bond between tool E1 and substrate. In the embodiment where the engagement surface 84A is pitched (see FIG. 4A) relative to the horizontal plane, and hence to surface S1 of the substrate, engagement between surface S1 and the engagement surface 84A occurs first on one side of the substrate. As the upper assembly 20 continues to move in the Z5 direction, the separation load in the region of engagement exceeds the local bond between tool E1 and substrate S thereby commencing separation therebetween. Further movement of assembly 20 in direction Z5, causes the engagement of the substrate with the pitched surface to move progressively across the substrate from one edge to the diametrically opposite edge. This in turn results in the progressive de-embossing of the tool E1 from the substrate. It is noted, that the freedom of movement of movable stage 54 prevents inadvertent loads from being applied by the lower embossing assembly 22 on assembly 200 that may reduce the separation loads applied at the bond interface between tool E1 and substrate S. The movement rate of the upper embossing assembly as well as the temperature of seating surface 38S may be controlled as desired with controller 100 (see FIG. 2) to provide any desired force and temperature loads at the substrate to tool interface.

Figure 11:
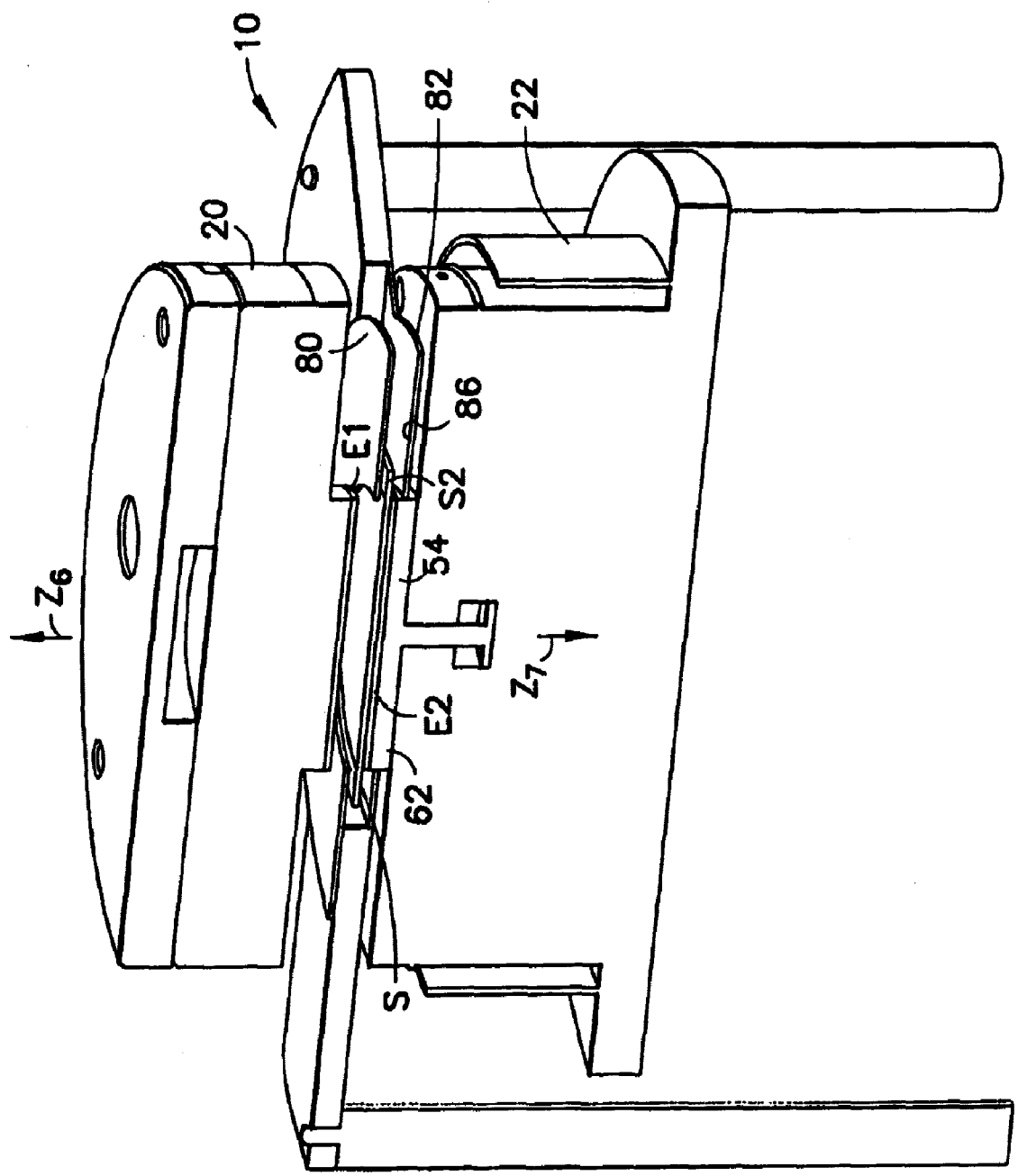
Figure 12:
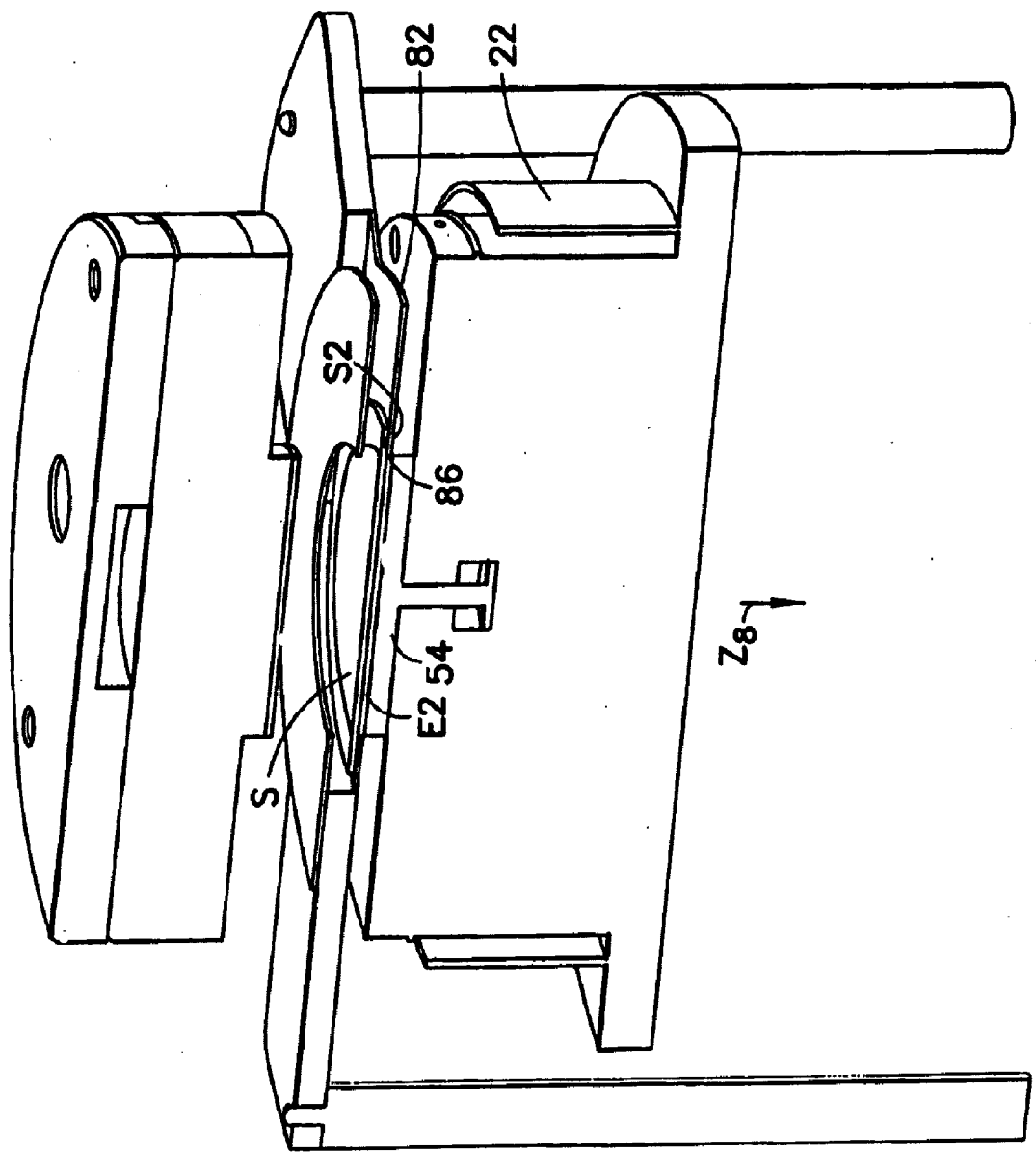
Figure 13:
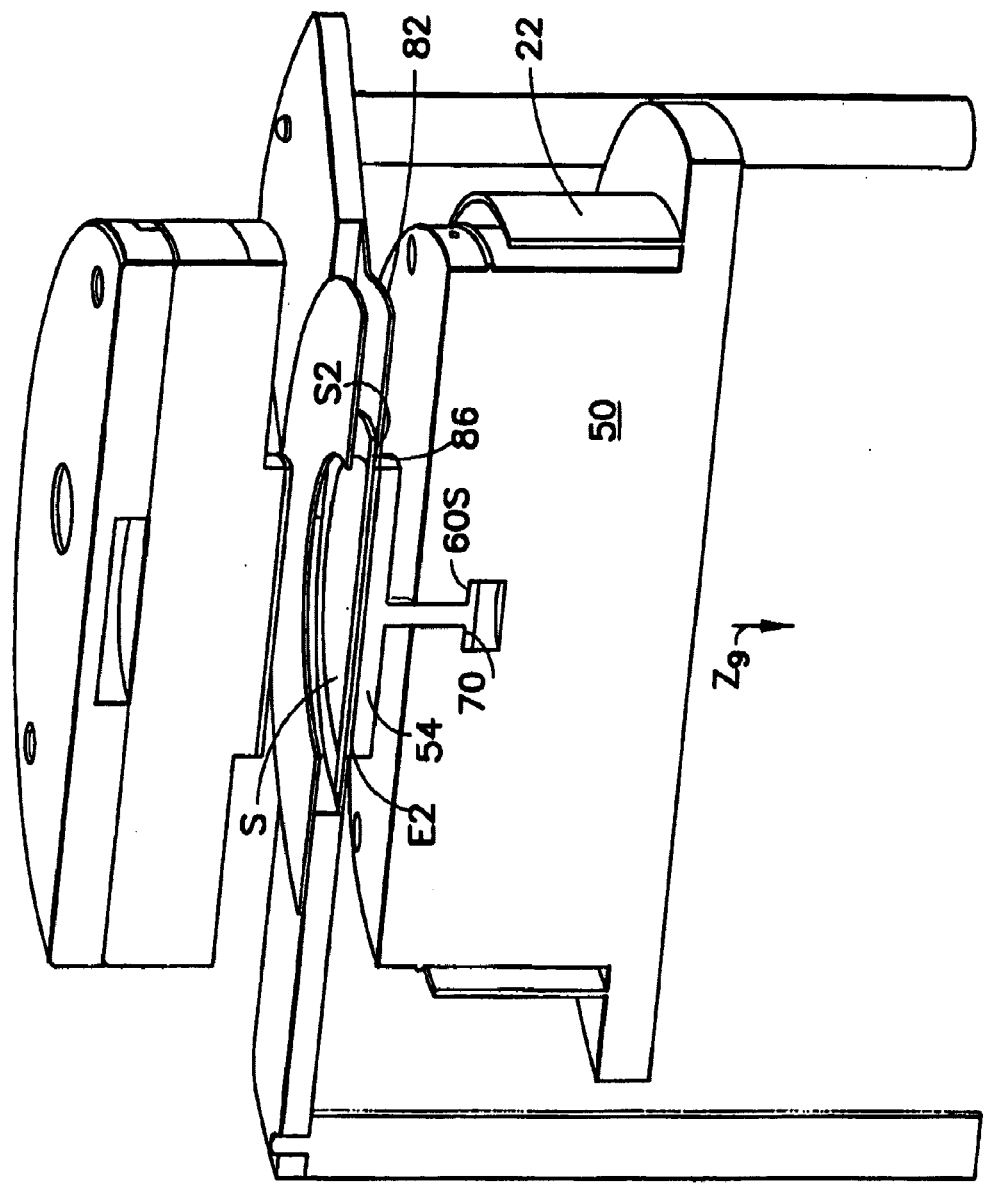
Figure 14:
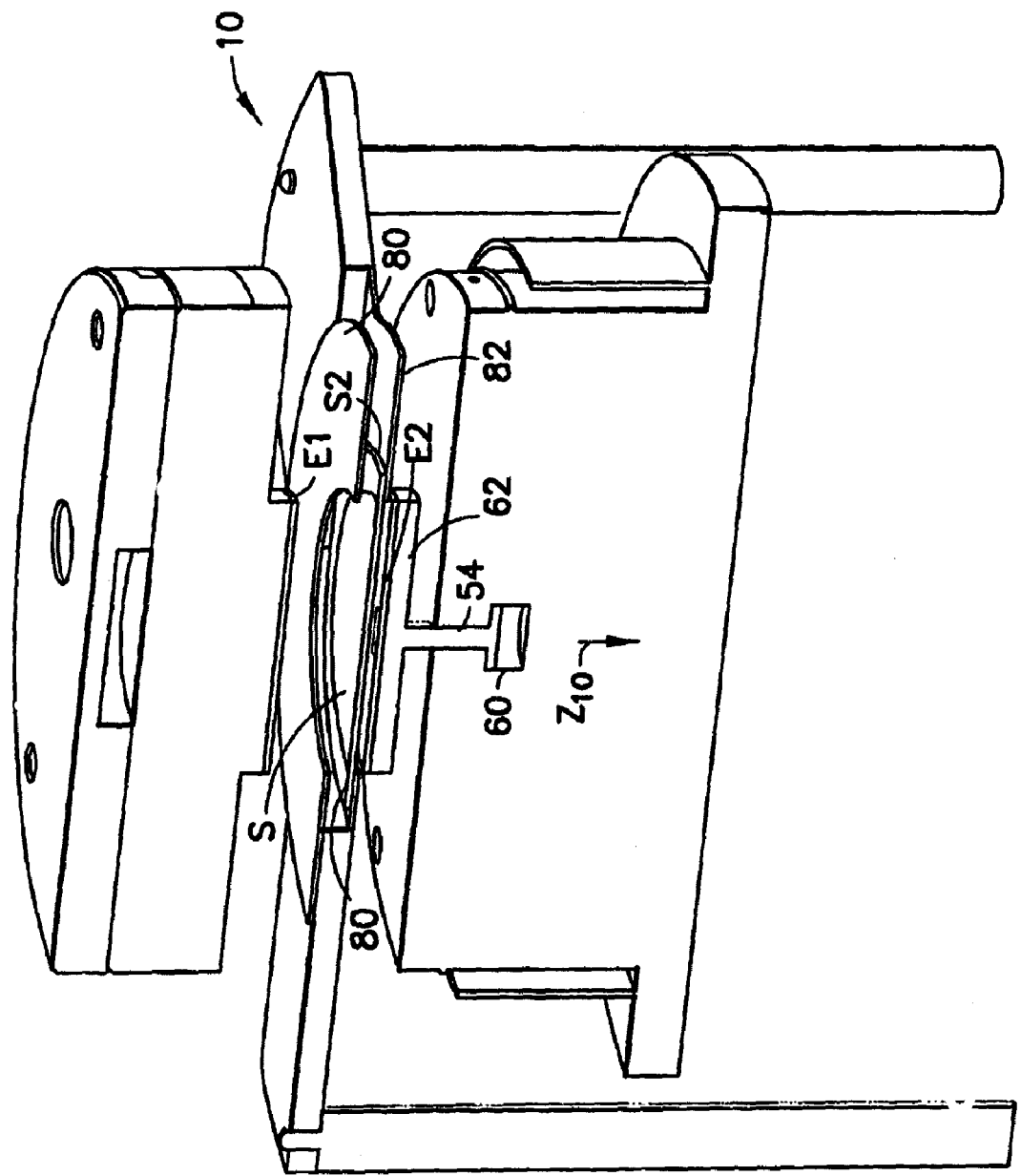

FIG. 11 shows the apparatus 10 in a position when the embossing tool E1 and substrate S are separated. Embossing tool E2 remains bonded to the substrate S. In the position shown in FIG. 11, the embossing tool E1 remains secured to the upper embossing assembly 20. The upper assembly 20 may be moved as desired in the direction indicated by arrow Z6, to a home position. The substrate S and embossing tool E2 remain connected to the lower embossing assembly 22 that is moved in the direction indicated by arrow Z7. Movement continues in the direction and the lower embossing assembly 22 with the substrate and embossing tool thereon reach the position shown in FIG. 12. In this position, the lower surface S2 of the substrate engages surface 86 of the lower separation member 82. Contact between the substrate S and the member 82 halts the movement of the movable stage 54, to which the substrate is connected via embossing tool E2, movement of the other portions of the lower assembly 22 may be continued in the direction indicated by arrow Zb in FIG. 8. Continued movement in this direction causes the movable stage 54 to be drawn out of heater section 50 until stop 70 abuts stop flange 60S. In this position see FIG. 13, the engagement between surface 86 of separation member 82 and the lower surface S2 of the substrate, results in loads being uniformly distributed on the substrate around the perimeter of the embossing tool E2. As noted before, in alternate embodiments, the engagement surface of the separating member may be angled relative to the mating substrate surface resulting in a variable load distribution in a manner similar to that described before with respect to surface 84A. When separation loads on the substrate S exceed the bond strength with tool E2, the tool and substrate are separated. The movement and temperature of the lower embossing assembly 22 are regulated by controller 100 to generate any desired loading and temperature conditions at the interface between embossing tool E2 and substrate S during separation. After separation, the movable stage 54 slides freely in socket 60 (in the direction indicated by arrow Z10 in FIG. 14) to return to its down position. The embossing tool E2 may remain secured to platform 62 of the movable stage 54. The substrate S may be removed from the apparatus 10 using for example transport apparatus 106 (see FIG. 2).

Figure 15:
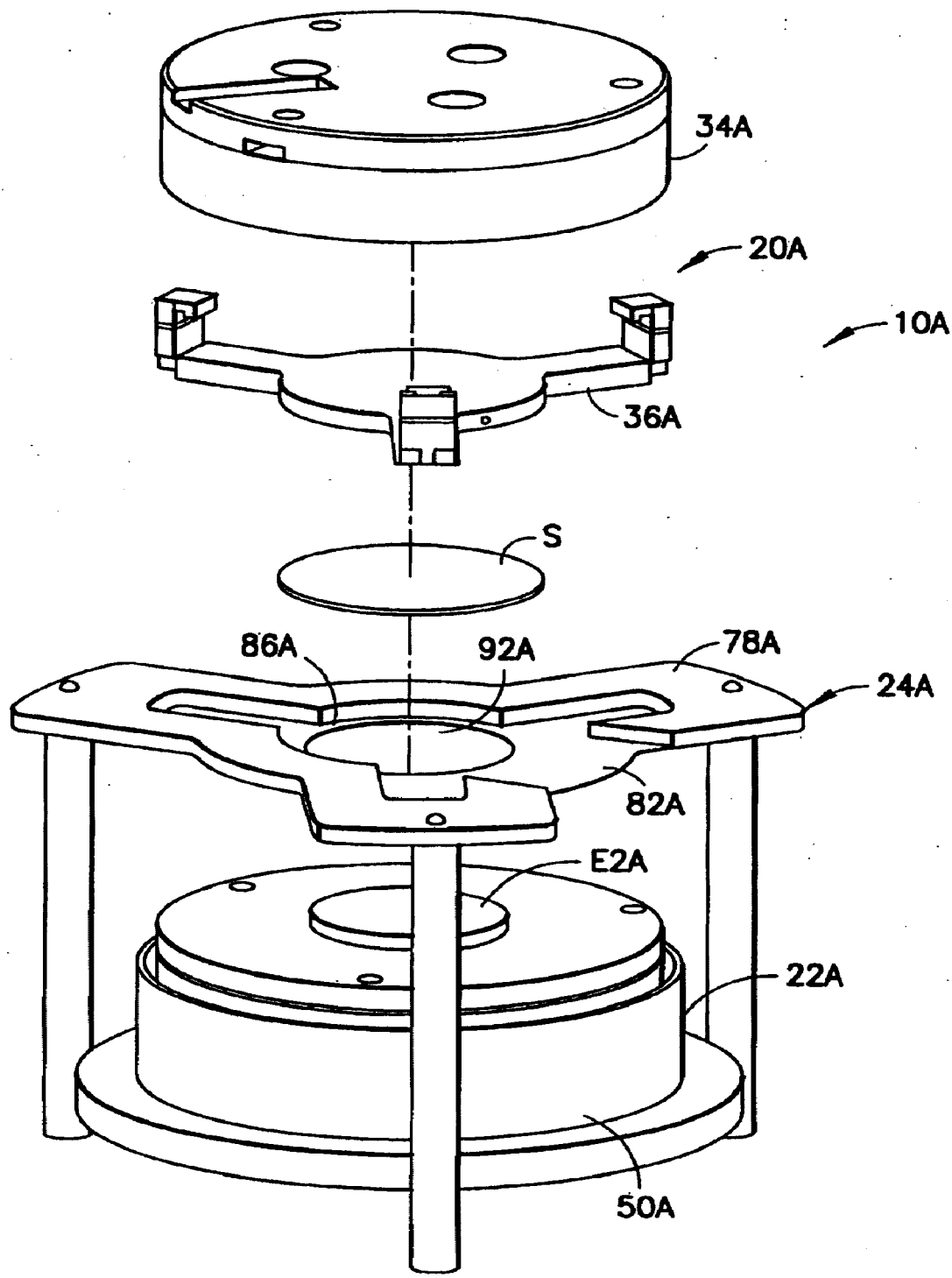
FIG. 15 is an exploded perspective view of a nanoimprinting lithography apparatus in accordance with another embodiment of the present invention.

FIG. 15 is an exploded perspective view of embossing sections of an nanoimprinting lithography apparatus 10A in accordance with another embodiment of the present invention and a substrate S. Apparatus 10A is generally similar to lithography apparatus 10 described before, and similar features are similarly numbered. Apparatus 10A also includes an upper assembly 20A, a lower embossing assembly 22A, and separating or de-embossing section 24A. In this embodiment, the upper assembly 20A includes a head section 34A and heater 36A, but may not have an embossing tool or means for holding an embossing tool. The upper assembly 20A may not be movable, unlike upper embossing assembly 20 in apparatus 10. The lower embossing assembly 22A may be substantially similar to embossing assembly 22 described before, except that an embossing tool E2A is fixedly mounted to the heater 50A in lieu of a movable stage. The apparatus 10A in this embodiment is capable of embossing one side of substrate S. In this embodiment, the separating section 24A is also substantially similar to separating section 24, except one separating member 82A is provided. Separating member 82A is substantially similar to separating member 82 described before, having a general ring shape that is connected to, in this embodiment is one piece with, the span member 78A. Separating member 82A has hole 92A and an engagement surface 86A extending around the edge of the hole. Embossing the thin film on the side of the substrate facing the embossing tool E2A, and then de-embossing the tool and substrate is performed in a manner similar to that described before with regards to the lower side of the substrate S in assembly 200.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

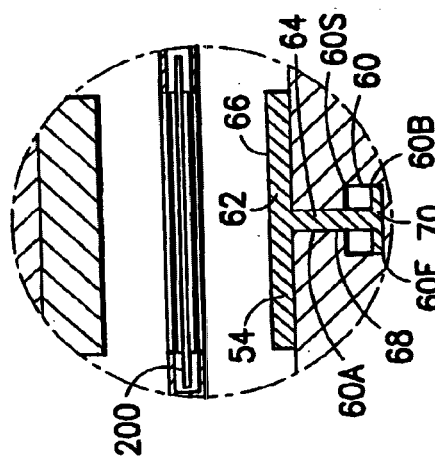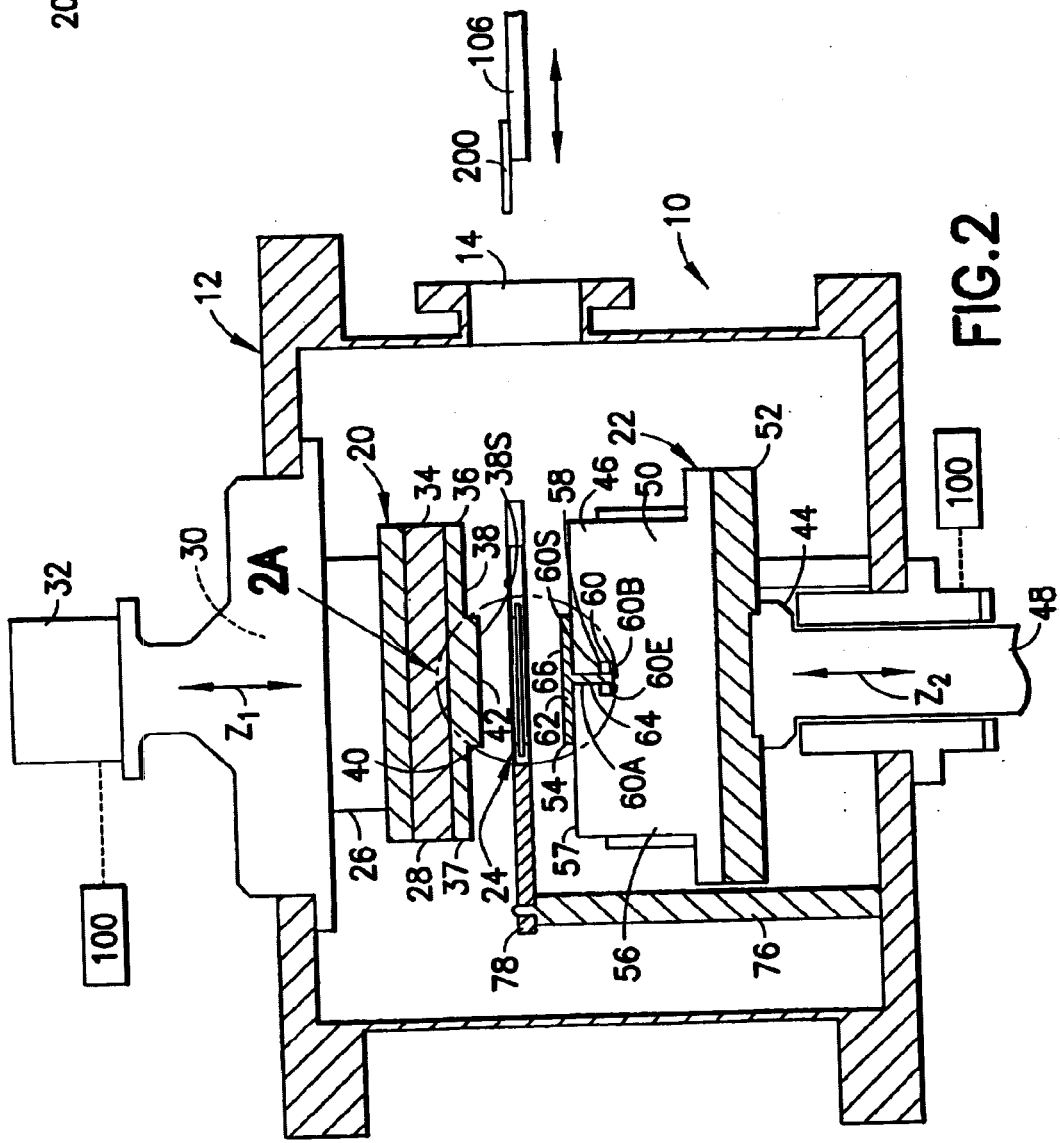

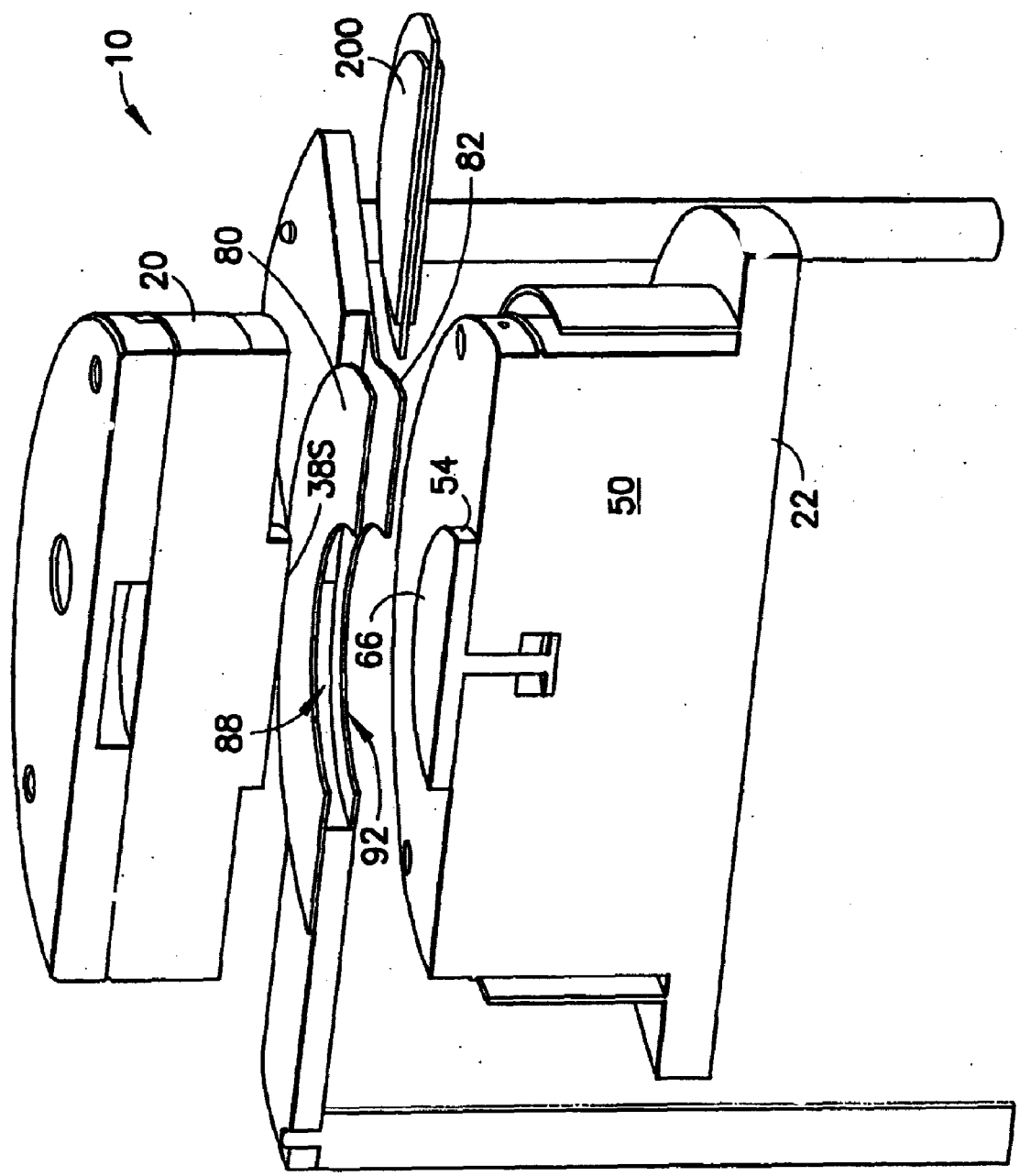

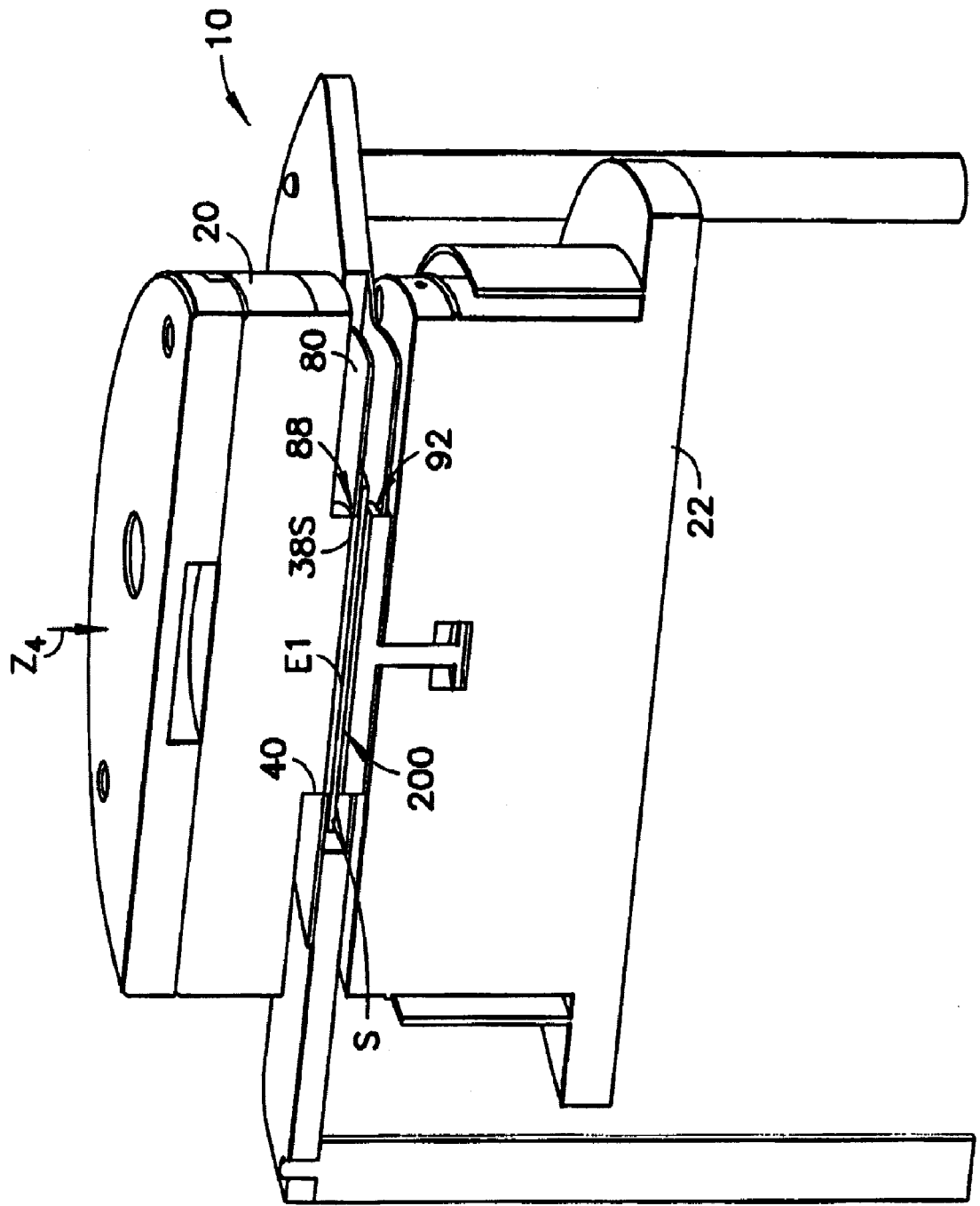

What is claimed is:

1. A nanoimprinting apparatus for imprinting nanostructure on a workpiece, the apparatus comprising:
    a frame;
    a platen connected to the frame for supporting the workpiece;
    an embossing tool connected to the frame for imprinting the nanostructure on the workpiece; and
    a separating tool connected to the frame for separating the workpiece and embossing tool, the separating tool having a workpiece engagement surface for engaging the workpiece when separating the workpiece and embossing tool;
    wherein the embossing tool extends through the separating tool.

2. The apparatus according to claim 1, wherein the separating tool has an opening formed therein through which the embossing tool extends.

3. The apparatus according to claim 2, wherein the engagement surface extends along at least part of the opening.

4. The apparatus according to claim 1, wherein the separating tool separates the workpiece and embossing tool when imprinting of the nanostructure on the workpiece is complete.

5. The apparatus according to claim 1, wherein a portion of the embossing tool extending through the separating tool contacts the workpiece.

6. The apparatus according to claim 1, wherein the engagement surface is disposed on the separating tool so that the engagement surface generally surrounds the embossing tool.

7. The apparatus according to claim 1, wherein the engagement surface is disposed on the separating tool so that the engagement surface engages the workpiece proximate an edge of the workpiece.

8. The apparatus according to claim 7, wherein the engagement surface engages the workpiece substantially around the edge of the workpiece.

9. The apparatus according to claim 1, wherein the separating tool comprises a ring section, the engagement surface being disposed at least in part on the ring section.

10. The apparatus according to claim 1, wherein when separating the workpiece and embossing tool, the separating tool biases the workpiece away from the embossing tool, the engagement surface generating a substantially linear bias distribution against the workpiece.

11. The apparatus according to claim 1, wherein the engagement surface is oriented at an angle to a plane of a seating surface of the workpiece engaged by the engagement surface.

12. The apparatus according to claim 1, wherein the separating tool and embossing tool are mounted to the frame so that there is relative motion between the separating tool and embossing tool.

13. The apparatus according to claim 1, wherein the separating tool is fixedly mounted to the frame.

14. The apparatus according to claim 1, further comprising another embossing tool connected to the frame on an opposite side of the separating tool from the embossing tool, the embossing tool and other embossing tool being operable to substantially simultaneously imprint nanostructure on opposite sides of the workpiece, wherein the separating tool engages the workpiece to separate the workpiece from both embossing tools.

15. The apparatus according to claim 1, further comprising a controller connected to at least one of the platen, the embossing tool, and the separating tool to control at least one of a force, or temperature applied to the workpiece, or a separation rate between the workpiece and embossing tool.

16. A nanoimprinting apparatus for imprinting nanostructure on a workpiece, the apparatus comprising:
    a frame;
    a pair of embossing tools connected to the frame for imprinting nanostructure on opposite sides of the workpiece; and
    a separating tool connected to the frame for separating the workpiece from the pair of embossing tools, wherein the separating tool has engagement surfaces for engaging the workpiece when the workpiece and the pair of embossing tools are being separated, and the engagement surfaces are located between the pair of embossing tools.

17. The apparatus according to claim 16, wherein the engagement surfaces comprise at least a pair of engagement surfaces disposed to face opposite sides of the workpiece.

18. The apparatus according to claim 16, wherein the separating tool has at least two openings formed therein, each of the pair of embossing tools extending through at least one of the openings in the separating tool.

19. The apparatus according to claim 17, wherein an engagement surface from the engagement surfaces extends along at least part of the edge of at least one of the openings.

20. A nanoimprinting assembly for a nanoimprinting tool, the assembly comprising:
    a flat panel having a nanostructure formed on at least one side of the flat panel; and
        an embossing tool connected to the flat panel, and having nanoimprinting features thereon for imprinting other nanostructure onto the flat panel, wherein the embossing tool has a free surface for mounting the assembly to the nanoimprinting tool, and wherein the embossing tool is sized and shaped to extend through a stripping part of the nanoimprinting tool when the assembly is mounted to the nanoimprinting tool.

21. The assembly according to claim 20, further comprising another embossing tool connected to the flat panel, the flat panel being sandwiched between the embossing tool and the other embossing tool.

22. The assembly according to claim 21, wherein the embossing tool and the other embossing tool imprint nanostructure on opposite sides of the flat panel.

23. The assembly according to claim 20, wherein the embossing tool is stripped from the flat panel by the stripping part of the nanoimprinting tool when imprinting of the other nanostructure on the flat panel is completed.

24. The assembly according to claim 20, wherein the embossing tool is bonded to the flat panel, the embossing tool being disposed against the side of the flat panel having the nanostructure formed thereon.

25. The assembly according to claim 20, wherein the flat panel and embossing tool are in registry with each other when the embossing tool and flat panel are bonded to each other.

26. The assembly according to claim 20, wherein the assembly is sized and shaped to be transported into the nanoimprinting tool through an access port of the nanoimprinting tool.

27. A method for imprinting nanostructure on a workpiece, the method comprising:

provingdividing a press having a platen, an embossing toll and a separating tool;

providing the separating tool with an opening formed therein;

placing the workpiece on the platen;

moving the embossing tool through the opening in the separating tool to contact the workpiece; and separating the workpiece and embossing tool with the separating tool, the separating tool engaging the workpiece to effect separation between workpiece and embossing tool.

* * * * *

UNITED STATES PATENT AND TRADEMARK OFFICE
CERTIFICATE OF CORRECTION

PATENT NO. : 6,829,988 B2
DATED : December 14, 2004
INVENTOR(S) : George et al.

It is certified that error appears in the above-identified patent and that said Letters Patent is hereby corrected as shown below:

Delete title page illustrating figure, and substitute new Title page illustrating figure (attached).

Delete drawing sheets 1-14, and substitute drawing sheets 1-14, with the attached sheets.

Signed and Sealed this

Sixth Day of June, 2006

JON W. DUDAS
*Director of the United States Patent and Trademark Office*